(12) United States Patent
Morishima

(10) Patent No.: US 11,193,064 B2
(45) Date of Patent: *Dec. 7, 2021

(54) PHASE DIFFERENCE PLATE FOR ORGANIC EL DISPLAY DEVICE, ORGANIC EL DISPLAY DEVICE, AND METHOD FOR PRODUCING PHASE DIFFERENCE PLATE

(71) Applicant: FUJIFILM Corporation, Tokyo (JP)

(72) Inventor: Shinichi Morishima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 111 days.

This patent is subject to a terminal disclaimer.

(21) Appl. No.: 16/693,749

(22) Filed: Nov. 25, 2019

(65) Prior Publication Data

US 2020/0087573 A1 Mar. 19, 2020

Related U.S. Application Data

(63) Continuation of application No. PCT/JP2018/023483, filed on Jun. 20, 2018.

(30) Foreign Application Priority Data

Jun. 21, 2017 (JP) .............................. JP2017-121590

(51) Int. Cl.
| | | |
|---|---|---|
| *G02F 1/13* | (2006.01) | |
| *C09K 19/34* | (2006.01) | |
| *C09K 19/32* | (2006.01) | |
| *H01L 27/32* | (2006.01) | |
| *H01L 51/52* | (2006.01) | |
| *H01L 51/56* | (2006.01) | |

(52) U.S. Cl.
CPC .......... *C09K 19/3497* (2013.01); *C09K 19/32* (2013.01); *C09K 19/3444* (2013.01); *C09K 19/3455* (2013.01); *C09K 19/3486* (2013.01); *H01L 27/3232* (2013.01); *H01L 51/5293* (2013.01); *H01L 51/56* (2013.01)

(58) Field of Classification Search
CPC .......................... C09K 19/3497; C09K 19/32; C09K 19/3444; C09K 19/3455; C09K 19/3486; C09K 19/60; C09K 19/3852; C09K 19/0448; C09K 19/3491; G02F 1/13; H01L 27/3232; H01L 51/5293; H01L 51/56; H01L 51/5281; C08F 220/30; H05B 33/02; G02B 5/30; G09F 9/00; G09F 9/30

See application file for complete search history.

(56) References Cited

U.S. PATENT DOCUMENTS

| | | |
|---|---|---|
| 2007/0298191 A1 | 12/2007 | Yamahara et al. |
| 2018/0002460 A1 | 1/2018 | Endo et al. |
| 2018/0016502 A1 | 1/2018 | Endo et al. |
| 2018/0066189 A1 | 3/2018 | Ishii et al. |
| 2018/0079958 A1 | 3/2018 | Ohno et al. |
| 2018/0112022 A1 | 4/2018 | Ishii et al. |
| 2020/0087573 A1* | 3/2020 | Morishima ............. H01L 51/56 |
| 2020/0091465 A1* | 3/2020 | Morishima ......... C08F 220/387 |

FOREIGN PATENT DOCUMENTS

| | | |
|---|---|---|
| CN | 101056903 A | 10/2007 |
| JP | 09-127885 A | 5/1997 |
| WO | 2016/114253 A1 | 7/2016 |
| WO | 2016/114346 A | 7/2016 |
| WO | 2016/114347 A1 | 7/2016 |
| WO | 2016/114348 A1 | 7/2016 |
| WO | 2016/194999 A1 | 12/2016 |
| WO | 2018/016567 A1 | 1/2018 |
| WO | 2018/101122 A1 | 6/2018 |

OTHER PUBLICATIONS

International Search Report issued in PCT/JP2018/023483 dated Sep. 18, 2018.
Written Opinion issued in PCT/JP2018/023483 dated Sep. 18, 2018.
International Preliminary Report on Patentability completed by WIPO dated Dec. 24, 2019 in connection with International Patent Application No. PCT/JP2018/023483.
Office Action, issued by the Japanese Patent Office dated May 19, 2020, in connection with Japanese Patent Application No. 2019-525666.
Office Action, issued by the Korean Intellectual Property Office dated Dec. 14, 2020, in connection with corresponding Korean Patent Application No. 10-2019-7035432.
Office Action, issued by the Korean Intellectual Property Office dated Jun. 18, 2021, in connection with corresponding Korean Patent Application No. 10-2019-7035432.
Office Action, issued by the State Intellectual Property Office dated May 6, 2021, in connection with corresponding Chinese Patent Application No. 201880036441.3.

* cited by examiner

*Primary Examiner* — Geraldina Visconti
(74) *Attorney, Agent, or Firm* — Edwards Neils LLC; Jean C. Edwards, Esq.

(57) ABSTRACT

An object of the present invention is to provide a phase difference plate for an organic EL display device having excellent light resistance, an organic EL display device, and a method for producing a phase difference plate. The phase difference plate for an organic EL display device of an embodiment of the present invention has a phase difference layer formed from a composition containing a polymer having a repeating unit A including a photo-alignment group and a polymerizable liquid crystal compound having reciprocal wavelength dispersion, in which the photo-alignment group includes a double bond structure of C=C or C=N.

20 Claims, No Drawings

PHASE DIFFERENCE PLATE FOR ORGANIC EL DISPLAY DEVICE, ORGANIC EL DISPLAY DEVICE, AND METHOD FOR PRODUCING PHASE DIFFERENCE PLATE

CROSS-REFERENCE TO RELATED APPLICATIONS

This application is a Continuation of PCT International Application No. PCT/JP2018/023483 filed on Jun. 20, 2018, which was published under PCT Article 21(2) in Japanese, and which claims priority under 35 U.S.C. § 119(a) to Japanese Patent Application No. 2017-121590 filed on Jun. 21, 2017. The above applications hereby expressly incorporated by reference, in their entirety, into the present application.

BACKGROUND OF THE INVENTION

1. Field of the Invention

The present invention relates to a phase difference plate for an organic EL display device, an organic EL display device, and a method for producing a phase difference plate.

2. Description of the Related Art

It is known that a circularly polarizing plate is used as an antireflection film so as to reduce the reflection of external light on a display surface in an image display device such as an organic electroluminescence (EL) display device.

As such a circularly polarizing plate, for example, an aspect in which a ¼ wavelength plate (λ/4 plate) and a polarizer are combined as described in JP1997-127885A (JP-H09-127885A) is known.

SUMMARY OF THE INVENTION

In recent years, a further improvement in optical characteristics required for an antireflection film has been demanded, and a control over a three-dimensional refractive index distribution defined as an Nz factor has become very important. It is considered that among those, a phase difference plate satisfying 0<Nz<1 can be suitably applied to antireflection film applications of an organic EL display device. For example, it is considered that a phase difference plate satisfying Nz=0.5 has a substantially constant phase difference value regardless of a viewing angle, and it is possible to significantly improve the viewing angle characteristics of an antireflection film using such a phase difference plate.

Under such circumstances, the present inventors have made an attempt to apply the phase difference plate described in JP2016-080942A as an antireflection film of an organic EL display device, and have thus revealed that the light resistance of the phase difference plate applied is deteriorated in some cases, depending on the type of a rod-like liquid crystalline compound or the type of a functional group (photo-alignment group) contained in a high molecular compound.

Therefore, an object of the present invention is to provide a phase difference plate for an organic EL display device having excellent light resistance, an organic EL display device, and a method for producing a phase difference plate.

The present inventors have conducted extensive studies to accomplish the object, and as a result, they have found that the light resistance of a phase difference layer formed is improved by using a polymer having a repeating unit A including a specific photo-alignment group and a polymerizable liquid crystal compound having reciprocal wavelength dispersion in combination, thereby completing the present invention.

That is, the present inventors have found that the object can be accomplished by the following configurations.

[1] A phase difference plate for an organic EL display device, comprising a phase difference layer formed from a composition containing a polymer having a repeating unit A including a photo-alignment group and a polymerizable liquid crystal compound having reciprocal wavelength dispersion, in which the photo-alignment group includes a double bond structure of C=C or C=N.

[2] The phase difference plate for an organic EL display device as described in [1], in which the photo-alignment group is a cinnamate group or a chalcone group.

[3] The phase difference plate for an organic EL display device as described in [1] or [2], in which the polymerizable liquid crystal compound having reciprocal wavelength dispersion is a liquid crystal compound represented by Formula (3) which will be described later.

[4] The phase difference plate for an organic EL display device as described in any one of [1] to [3], in which the polymer is an acrylic or methacrylic polymer.

[5] The phase difference plate for an organic EL display device as described in any one of [1] to [4], in which the phase difference layer satisfies Formula (I), $$Re(450) \leq Re(550) \leq Re(650) \quad \text{(I)}$$

in Formula (I), Re(450) represents an in-plane retardation value measured at a wavelength of 450 nm, Re(550) represents an in-plane retardation value measured at a wavelength of 550 nm, and Re(650) represents an in-plane retardation value measured at a wavelength of 650 nm.

[6] The phase difference plate for an organic EL display device as described in any one of [1] to [5], in which the phase difference layer is a layer indicating an in-plane retardation value measured at a wavelength of 550 nm of 100 to 180 nm.

[7] The phase difference plate for an organic EL display device as described in any one of [1] to [6], in which the phase difference layer is a layer indicating a thickness-direction retardation value measured at a wavelength of 550 nm of −10 to 10 nm.

[8] The phase difference plate for an organic EL display device as described in any one of [1] to [7], in which the phase difference layer satisfies a refractive index relationship represented by Formula (II), $$nx > nz > ny \quad \text{(II)}$$

in Formula (II), nx is a refractive index in a direction in which a refractive index is maximum in a plane, ny is a refractive index in a direction in which a refractive index is minimum in a plane, and nz represents a refractive index in a thickness direction perpendicular to nx and ny.

[9] The phase difference plate for an organic EL display device as described in any one of [1] to [8], in which the phase difference layer satisfies Formula (III), $$0.4 < (nx-nz)/(nx-ny) < 0.6 \quad \text{(III)}$$

in Formula (III), nx is a refractive index in a direction in which a refractive index is maximum in a plane, ny is a refractive index in a direction in which a refractive index is minimum in a plane, and nz represents a refractive index in a thickness direction perpendicular to nx and ny.

[10] The phase difference plate for an organic EL display device as described in any one of [1] to [9], in which the phase difference layer is a monolayer structure.

[11] An organic EL display device comprising:
the phase difference plate for an organic EL display device as described in any one of [1] to [10]; and
an organic EL light emitting element.

[12] A method for producing a phase difference plate, used for the manufacture of the phase difference plate for an organic EL display device as described in any one of [1] to [10], the method comprising:
an applying step of applying a composition containing a polymer having a repeating unit A including a photo-alignment group including a double bond structure of C=C or C=N and a polymerizable liquid crystal compound having reciprocal wavelength dispersion onto a transparent support to form a coating film;
an irradiating step of performing irradiation with polarized ultraviolet rays from a direction perpendicular to the coating film; and
a heating step of subjecting the coating film to a heating treatment after the irradiating step to form a phase difference layer.

According to the present invention, it is possible to provide a phase difference plate for an organic EL display device having excellent light resistance, an organic EL display device, and a method for producing a phase difference plate.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

Furthermore, in the present specification, a numerical value range expressed using "to" is used in a meaning of a range that includes the preceding and succeeding numerical values of "to" as the lower limit value and the upper limit value, respectively.

In addition, in the present specification, the bonding direction of a divalent group (for example, —O—CO—) denoted is not particularly limited, and for example, in a case where $D^1$ in Formula (3) which will be described later is —O—CO—, a position bonding to the Ar side is defined as *1, and a position bonding to the $G^1$ side is defined as *2, $D^1$ may be either *1-O—CO—*2 or *1-CO—O-*2.

[Phase Difference Plate for Organic EL Display Device]

The phase difference plate for an organic EL display device of an embodiment of the present invention (hereinafter also simply referred to as "the phase difference plate of the embodiment of the present invention") has a phase difference layer formed from a composition (hereinafter also simply referred to as a "specific composition") containing a polymer (hereinafter also simply referred to as a "specific polymer") having a repeating unit A including a photo-alignment group and a polymerizable liquid crystal compound having reciprocal wavelength dispersion, In addition, the photo-alignment group included in the repeating unit A includes a double bond structure of C=C or C=N.

In the present invention, the light resistance is improved by incorporation of a phase difference layer formed from a specific composition containing a specific polymer having a repeating unit A including a photo-alignment group including a double bond structure of C=C or C=N and a polymerizable liquid crystal compound having reciprocal wavelength dispersion, as described above.

Details thereof are not clear, but are presumed as follows by the present inventors.

That is, it is possible to express desired optical characteristics, specifically biaxial phase difference having reciprocal wavelength dispersion, by allowing a polymer having a repeating unit A including a specific photo-alignment group to contribute to the alignment of the polymerizable liquid crystal compound having reciprocal wavelength dispersion. At this time, by using a specific polymer having a repeating unit A including a photo-alignment group including a double bond structure of C=C or C=N in combination, the photo-alignment group or a photoreactive substance thereof can have absorptivity at a shorter wave than the light emitting spectrum of an organic EL light emitting element, and therefore, even in a case where the phase difference plate is used in applications as an antireflection film in an organic EL display device having a high light emission intensity from an organic EL light emitting element, it is possible to maintain a desired alignment state while suppressing deterioration due to light irradiation, whereby the durability is improved.

[Specific Composition]

The phase difference layer contained in the phase difference plate of the embodiment of the present invention is formed from a specific composition containing a specific polymer having a repeating unit A including a photo-alignment group including a double bond structure of C=C or C=N and a polymerizable liquid crystal compound having reciprocal wavelength dispersion, as described above.

<Specific Polymer>

(Repeating Unit A)

The repeating unit A contained in the specific polymer is a repeating unit including a photo-alignment group including a double bond structure of C=C or C=N, and examples thereof include a repeating unit represented by Formula (1) or (2).

In Formulae (1) and (2), R represents a hydrogen atom or an alkyl group having 1 to 6 carbon atoms, L represents a divalent linking group, and P represents a photo-alignment group including a double bond structure of C=C or C=N.

Here, in Formulae (1) and (2), R is preferably a hydrogen atom or an alkyl group having 1 to 4 carbon atoms (for example, a methyl group, an ethyl group, an n-propyl group, an isopropyl group, and an n-butyl group), and among these, and the hydrogen atom or the methyl group is more preferable.

Moreover, the double bond structure of C=C or C=N represented by P in Formulae (1) and (2) is preferably a trans type rather than a cis type, and more preferably a trans type C=C.

Specific suitable examples of such a photo-alignment group including a double bond structure include a cinnamate group, a chalcone group, and a maleimido group; and among these, the cinnamate group or the chalcone group is preferable, and the cinnamate group is more preferable, for a reason that the group has a high sensitivity to polarized ultraviolet rays and thus, the light resistance of a phase difference plate thus obtained is further improved.

In the present invention, as long as the double bond structure of C=C or C=N represented by P in Formulae (1) and (2) may have a substituent as long as the structure does not lose photo-alignment properties. Specific examples of the substituent include a hydroxyl group, a carboxyl group, a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, and an amino group. Incidentally, a proton of the carboxyl group may be dissociated or combined with a counterion (for example, an alkali metal ion) to form the state of a salt.

Examples of the halogen atom as the substituent include a fluorine atom, a chlorine atom, a bromine atom, and an iodine atom, and among these, the fluorine atom or the chlorine atom is preferable.

With regard to the linear, branched, or cyclic alkyl group having 1 to 20 carbon atoms as the substituent, as the linear alkyl group, an alkyl group having 1 to 6 carbon atoms is preferable, and specific examples thereof include a methyl group, an ethyl group, and an n-propyl group.

As the branched alkyl group, an alkyl group having 3 to 6 carbon atoms is preferable, and specific examples thereof include an isopropyl group and a tert-butyl group.

As the cyclic alkyl group, an alkyl group having 3 to 6 carbon atoms is preferable, and specific examples thereof include a cyclopropyl group, a cyclopentyl group, and a cyclohexyl group.

As the linear halogenated alkyl group having 1 to 20 carbon atoms as the substituent, a fluoroalkyl group having 1 to 4 carbon atoms is preferable, specific examples thereof include a trifluoromethyl group, a perfluoroethyl group, a perfluoropropyl group, and a perfluorobutyl group, and among these, the trifluoromethyl group is preferable.

As the alkoxy group having 1 to 20 carbon atoms as the substituent, an alkoxy group having 1 to 8 carbon atoms is preferable, specific examples thereof include a methoxy group, an ethoxy group, an n-butoxy group, and a methoxyethoxy group, and among these, the methoxy group or the ethoxy group is preferable.

As the aryl group having 6 to 20 carbon atoms as the substituent, an aryl group having 6 to 12 carbon atoms is preferable, specific examples thereof include a phenyl group, an .-methylphenyl group, and a naphthyl group, and among these, the phenyl group is preferable.

As the aryloxy group having 6 to 20 carbon atoms as the substituent, an aryloxy group having 6 to 12 carbon atoms is preferable, specific examples thereof include a phenyloxy group and a 2-naphthyloxy group, and among these, the phenyloxy group is preferable.

Examples of the amino group as the substituent include a primary amino group (—NW); a secondary amino group such as a methylamino group; and a tertiary amino group such as a dimethylamino group, a diethylamino group, a dibenzylamino group, and a group having the nitrogen atom of a nitrogen-containing heterocyclic compound (for example, pyrrolidine, piperidine, and piperazine) as a bond.

Furthermore, examples of the divalent linking group represented by L in Formulae (1) and (2) include a divalent linking group formed by combination of at least two or more groups selected from the group consisting of a linear, branched, or cyclic alkylene group having 1 to 10 carbon atoms, which may have a substituent, an arylene group having 6 to 12 carbon atoms, which may have a substituent, an ether group (—O—), a carbonyl group (—C(=O)—), and an imino group (—NH—) which may have a substituent.

Here, examples of the substituent which may be contained in each of the alkylene group, the arylene group, and the imino group include an alkyl group, an alkoxy group, a halogen atom, and a hydroxyl group.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among these, the fluorine atom or the chlorine atom is preferable.

With regard to the linear, branched, or cyclic alkylene group having 1 to 10 carbon atoms, specific examples of the linear alkylene group include a methylene group, an ethylene group, a propylene group, a butylene group, a pentylene group, a hexylene group, and a decylene group.

Moreover, specific examples of the branched alkylene group include a dimethylmethylene group, a methylethylene group, a 2,2-dimethylpropylene group, and a 2-ethyl-2-methylpropylene group.

In addition, specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbonane-diyl group, and an exo-tetrahydrodicyclopentadiene-diyl group, and among these, the cyclohexylene group is preferable.

Specific examples of the arylene group having 6 to 12 carbon atoms include a phenylene group, a xylylene group, a biphenylene group, a naphthylene group, and a 2,2'-methylenebisphenyl group, and among these, the phenylene group is preferable.

In the present invention, L in Formulae (1) and (2) is preferably a divalent linking group including at least an arylene group having 6 to 12 carbon atoms, which may have a substituent, and more preferably a divalent linking group including at least a linear alkylene group having 1 to 10 carbon atoms, which may have a substituent, and an arylene group having 6 to 12 carbon atoms, which may have a substituent.

Moreover, in the present invention, L in Formulae (1) and (2) is preferably a divalent linking group including a mesogen group.

Here, suitable examples of the mesogen group include a group represented by (MG-I).

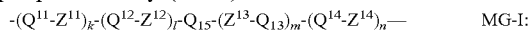
$-(Q^{11}-Z^{11})_k-(Q^{12}-Z^{12})_l-Q_{15}-(Z^{13}-Q_{13})_m-(Q^{14}-Z^{14})_n-$  MG-I:

In the formula, $Q^{11}$, $Q^{12}$, $Q^{13}$, $Q^{14}$, and $Q^{15}$ each independently represent a 1,4-phenylene group (hereinafter also referred to as a "benzene ring"), a heterocyclic group obtained by substituting one or two or more CH groups of a 1,4-phenylene group with N, a 1,4-cyclohexylene group (hereinafter also referred to as a "cyclohexane ring"), a heterocyclic group obtained by optionally substituting one $CH_2$ group or two non-adjacent $CH_2$ groups of a 1,4-cyclohexylene group with O and/or S, a 1,4-cyclohexenylene group, or a naphthalene-2,6-diyl group. These groups may have a substituent. Among those, it is preferable that $Q^{15}$ is a benzene ring, and $Q^{11}$, $Q^{12}$, $Q^{13}$ and $Q^{14}$ are each independently a benzene ring or a cyclohexane ring from the viewpoint of cost and the like.

In addition, in the formula, $Z^{11}$, $Z^{12}$, $Z^{13}$, and $Z^{14}$ each independently represent —COO—, —OCO—, —COOCH$_2$CH$_2$—, —CH$_2$CH$_2$OCO—, —CH$_2$CH$_2$—, —OCH$_2$—, —CH$_2$O—, —CH=CH—, —C≡C—, —CH=CH—COO—, —OCO—CH=CH—, —NH=CH$_2$—, —CH$_2$=NH—, —SCO—, —OCS—, or a single bond. Among these, —COO—, —OCO—, —COOCH$_2$CH$_2$—, or —CH$_2$CH$_2$OCO— is preferable from the viewpoint of cost and the like.

In addition, in the formula, k, l, m, and n are each independently an integer of 0 to 2.

Furthermore, in the present invention, as the repeating unit A including a photo-alignment group including a double bond structure of C=C or C=N, the repeating unit represented by Formula (1) is preferable, and a repeating unit represented by Formula (1a) or (1 b) including a cinnamate group as a photo-alignment group is more preferable, among the repeating units represented by Formulae (1) and (2).

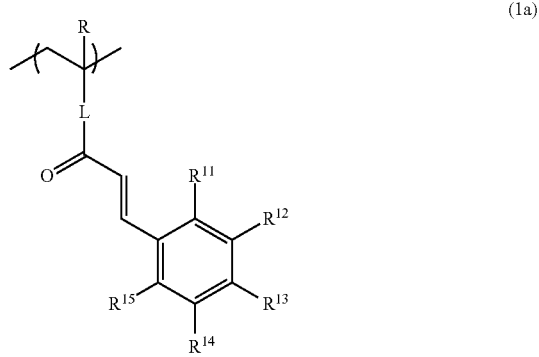
(1a)

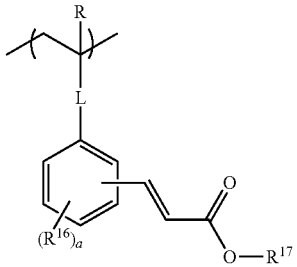
(1b)

In Formulae (1a) and (1b), R and L are both the same as those described in Formula (1).

In addition, $R^{11}$ to $R^{15}$ in Formula (1a) and $R^{16}$ in Formula (1b) each independently represent a hydrogen atom or a substituent. In $R^{11}$, $R^{12}$, $R^{13}$, $R^{14}$, and $R^{15}$, two adjacent groups may be bonded to each other to form a ring. Further, among $R^{11}$, $R^{12}$, $R^{13}$, $R^{14}$, and $R^{15}$, $R^{13}$ in the para-position is preferably a substituent. Further, examples of the substituent include a hydroxyl group, a carboxyl group, a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, and an amino group, which are exemplified as a substituent which may be contained in the photo-alignment group.

In addition, in Formula (1b), $R^{16}$ represents a monovalent organic group and a represents an integer of 0 to 5. In a case where a is 2 or more, a plurality of $R^{16}$'s may be the same as or different from each other. Further, examples of the monovalent organic group of $R^{16}$ include a chained or cyclic alkyl group having 1 to 20 carbon atoms, and an aryl group having 6 to 20 carbon atoms, which may have a substituent.

In the present invention, it is preferable that the specific polymer having the above-mentioned repeating unit A is an acrylic or methacrylic polymer for a reason that liquid crystallinity is easily afforded and phase difference is easily expressed by a heating treatment after irradiation with polarized ultraviolet rays.

Specific suitable examples of such a polymer include polymers having repeating units represented by Formulae (A-1) to (A-7).

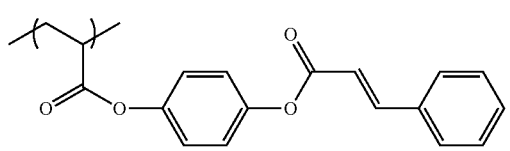
(A-1)

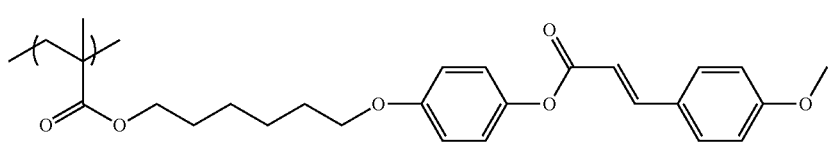
(A-2)

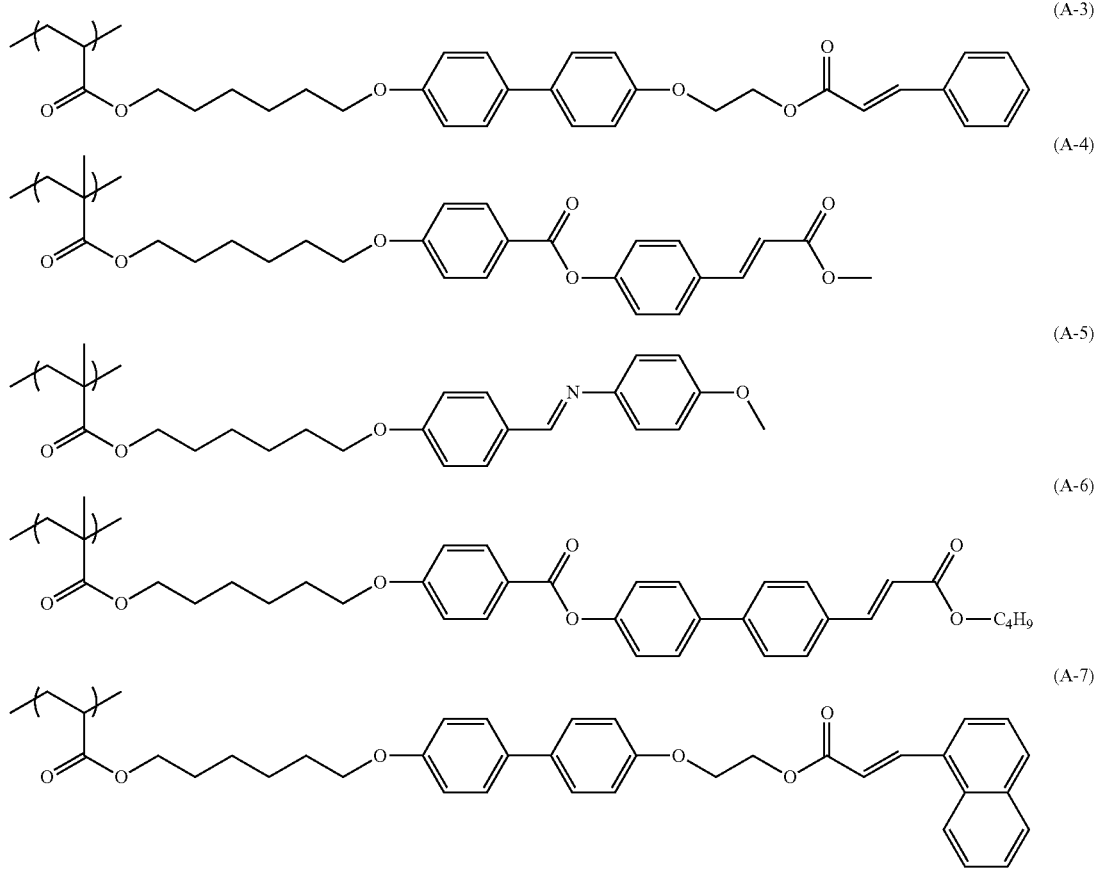

Moreover, as long as the effect of the present invention is not inhibited, the specific polymer may have other repeating units, in addition to the above-mentioned repeating unit A.

Examples of a monomer (radically polymerizable monomer) that forms such other repeating units include an acrylic acid ester compound, a methacrylic acid ester compound, a maleimide compound, an acrylamide compound, an acrylonitrile, a maleic anhydride, a styrene compound, and a vinyl compound.

In addition, in a case where the specific polymer has other repeating units, the content of the above-mentioned repeating unit A is preferably 50% to 95% by mass, more preferably 60% to 90% by mass, and still more preferably 70% to 90% by mass, with respect to 100% by mass of all the repeating units contained in the specific polymer. In the present invention, the content of each of the repeating units included in the specific polymer is calculated based on the introduction amount (mass) of each of the monomers used so as to obtain each of the repeating units.

Furthermore, a method for synthesizing the specific polymer is not particularly limited, and for example, the specific polymer can be synthesized by mixing a monomer that forms the above-mentioned repeating unit A and a monomer that forms any other repeating units, and performing polymerization using a radical polymerization initiator in an organic solvent.

In addition, the weight-average molecular weight (Mw) of the specific polymer is preferably 100,000 or less, more preferably 50,000 or less, and still more preferably 3,000 to 30,000.

Here, the weight-average molecular weight in the present invention is a value measured by gel permeation chromatography (GPC) under the conditions shown below.

Solvent (eluent): Tetrahydrofuran (THF)
Device Name: TOSOH HLC-8320GPC
Column: 3 columns of TOSOH TSKgel Super HZM-H (4.6 mm×15 cm) connected to each other are used.
Column temperature: 40° C.
Sample Concentration: 0.1% by mass
Flow rate: 1.0 ml/min
Calibration Curve: A calibration curve obtained from 7 samples of TSK standard polystyrene Mw in a range of 2,800,000 to 1,050 (Mw/Mn=1.03 to 1.06) manufactured by TOSOH Corporation is used.

<Polymerizable Liquid Crystal Compound>

The specific composition used for the formation of the phase difference layer contains a polymerizable liquid crystal compound having reciprocal wavelength dispersion.

Here, in the present specification, the polymerizable liquid crystal compound having "reciprocal wavelength dispersion" means that in a case where an in-plane retardation (Re) value at a specific wavelength (visible light range) of a phase difference film manufactured using prepared using the polymerizable liquid crystal compound is measured, the Re value becomes equal or higher as the measurement wavelength is increased.

In addition, in the present specification, the "polymerizable liquid crystal compound" refers to a liquid crystal compound having a polymerizable group. Further, the type of the polymerizable group contained in the polymerizable liquid crystal compound is not particularly limited, and examples thereof include an acryloyl group, a methacryloyl group, a vinyl group, a styryl group, and an allyl group.

The type of the polymerizable liquid crystal compound is not particularly limited and can be classified into a rod-like type (rod-like liquid crystal compound) and a disk-like type (disk-like liquid crystal compound), depending on the shape. Each of the types further includes a low molecular type and a high molecular type, respectively. The "high molecular type" generally refers to a polymer having a degree of polymerization of 100 or more (Kobunshi Butsuri Souten-i Dainamikusu (Polymer Physics and Phase Transition Dynamics), written by Masao Doi, p. 2, Iwanami Shoten, Publishers, 1992). In the present invention, any liquid crystal compound can be used. Two or more kinds of the rod-like liquid crystal compounds, two or more kinds of the disk-like liquid crystal compounds, or a mixture of the rod-like liquid crystal compound and the disk-like liquid crystal compound may be used.

Among those, the rod-like liquid crystal compound is preferably used. A reason therefor is that it is advantageous to make it easy to allow a phase difference film thus formed to function as a positive A-plate by homogeneously (horizontally) aligning the rod-like liquid crystal compound.

The polymerizable liquid crystal compound is not particularly limited as long as it is capable of forming a film having reciprocal wavelength dispersion as described above, and for example, the compound represented by General Formula (I) described in JP2008-297210A (in particular, the compounds described in paragraph Nos. [0034] to [0039]), the compound represented by General Formula (1) described in JP2010-084032A (in particular, the compounds described in paragraph Nos. [0067] to [0073]), a liquid crystal compound represented by Formula (3) which will be described later, or the like can be used.

In the present invention, from the viewpoint that the polymerizable liquid crystal compound has more excellent reciprocal wavelength dispersion, a liquid crystal compound represented by Formula (3) is preferable.

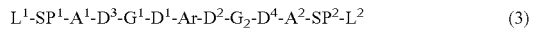

$$L^1\text{-}SP^1\text{-}A^1\text{-}D^3\text{-}G^1\text{-}D^1\text{-}Ar\text{-}D^2\text{-}G_2\text{-}D^4\text{-}A^2\text{-}SP^2\text{-}L^2 \quad (3)$$

In Formula (3), $D^1$, $D^2$, $D^3$, and $D^4$ each independently represent a single bond, —O—CO—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—. $R^1$, $R^2$, $R^3$, and $R^4$ each independently represent a hydrogen atom, a fluorine atom, or an alkyl group having 1 to 4 carbon atoms.

Moreover, in Formula (3), $G^1$ and $G^2$ each independently represent a divalent alicyclic hydrocarbon group having 5 to 8 carbon atoms, in which one or more of —CH$_2$—'s constituting the alicyclic hydrocarbon group may be substituted with —O—, —S—, or —NH—.

Furthermore, in Formula (3), $A^1$ and $A^2$ each independently represent an aromatic ring having 6 or more carbon atoms, or a cycloalkane ring having 6 or more carbon atoms.

In addition, in Formula (3), $SP^1$ and $SP^2$ each independently represent a single bond, a linear or branched alkylene group having 1 to 12 carbon atoms, or a divalent linking group in which one or more of —CH$_2$—'s constituting the linear or branched alkylene group having 1 to 12 carbon atoms are substituted with —O—, —S—, —NH—, —N(Q)-, or —CO—, and Q represents a substituent.

Moreover, in Formula (3), $L^1$ and $L^2$ each independently represent a monovalent organic group, and at least one of $L^1$ or $L^2$ represents a polymerizable group. It should be noted that in a case where Ar is an aromatic ring represented by Formula (Ar-3) which will be described later, at least one of $L^1$ or $L^2$, or $L^3$ or $L^4$ in Formula (Ar-3) which will be described later represents a polymerizable group.

Furthermore, in Formula (3), Ar represents any one aromatic ring selected from the group consisting of groups represented by Formulae (Ar-1) to (Ar-5) which will be described later.

In Formula (3), as the divalent alicyclic hydrocarbon group having 5 to 8 carbon atoms represented by each of $G^1$ and $G^2$, a 5- or 6-membered ring is preferable. Further, the alicyclic hydrocarbon group may be saturated or unsaturated, but a saturated alicyclic hydrocarbon group is preferable. With regard to the divalent alicyclic hydrocarbon group represented by each of $G^1$ and $G^2$, reference can be made to, for example, the description in paragraph 0078 of JP2012-021068A, the contents of which are incorporated herein by reference.

In Formula (3), examples of the aromatic ring having 6 or more carbon atoms represented by each of $A^1$ and $A^2$ include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring. Among these, the benzene ring (for example, a 1,4-phenyl group) is preferable.

In addition, in Formula (3), examples of the cycloalkane ring having 6 or more carbon atoms represented by each of $A^1$ and $A^2$ include a cyclohexane ring, a cycloheptane ring, a cyclooctane ring, a cyclododecane ring, and a cyclodocosane ring. Among these, the cyclohexane ring (for example, a 1,4-cyclohexylene group) is preferable, and a trans-1,4-cyclohexylene group is more preferable.

In Formula (3), suitable examples of the linear or branched alkylene group having 1 to 12 carbon atoms represented by each of $SP^1$ and $SP^2$ include a methylene group, an ethylene group, a propylene group, and a butylene group.

In Formula (3), examples of the monovalent organic group represented by each of $L^1$ and $L^2$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be monocyclic or polycyclic, but is preferably monocyclic. The number of carbon atoms of the aryl group is preferably 6 to 25, and more preferably 6 to 10. In addition, the heteroaryl group may be monocyclic or polycyclic. The number of heteroatoms constituting the heteroaryl group is preferably 1 to 3. The heteroatom constituting the heteroaryl group is preferably a nitrogen atom, a sulfur atom, or an oxygen atom. The number of carbon atoms of the heteroaryl group is preferably 6 to 18, and more preferably 6 to 12. Incidentally, the alkyl group, the aryl group, or the heteroaryl group may be unsubstituted or may have a substituent. Examples of the substituent include the same ones as the substituents which may be contained in Y' in Formula (Ar-1).

On the other hand, in Formula (3), the polymerizable group represented by at least one of $L^1$ or $L^2$ is not particularly limited, but is preferably a polymerizable group which is radically polymerizable or cationically polymerizable.

A generally known radically polymerizable group can be used as the radically polymerizable group, and suitable examples thereof include an acryloyl group and a methacryloyl group. In this case, it is known that the acryloyl group generally exhibits a fast polymerization rate, the acryloyl group is preferable from the viewpoint of an improvement in productivity, but similarly, the methacryloyl group can also be used as the polymerizable group.

In addition, a generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among these, the alicyclic ether group or the vinyloxy group is preferable, and an epoxy group, an oxetanyl group, or a vinyloxy group is particularly preferable.

Particularly preferred examples of the polymerizable group include the following groups.

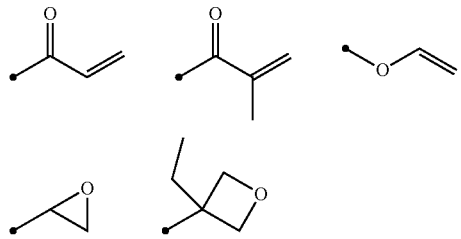

In Formula (3), Ar represents any one aromatic ring selected from the group consisting of groups represented by Formulae (Ar-1) to (Ar-5). In addition, in Formulae (Ar-1) to (Ar-5), * represents a bonding position to $D^1$ or $D^2$ in Formula (3).

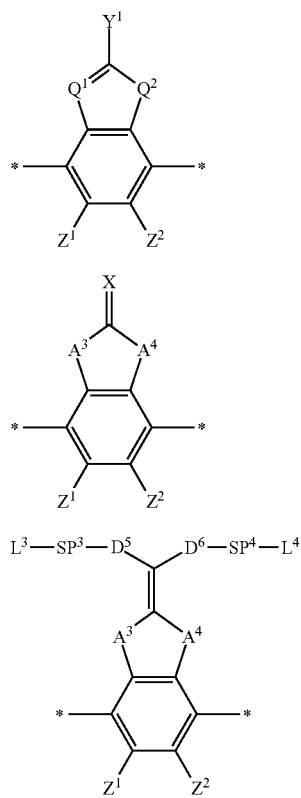

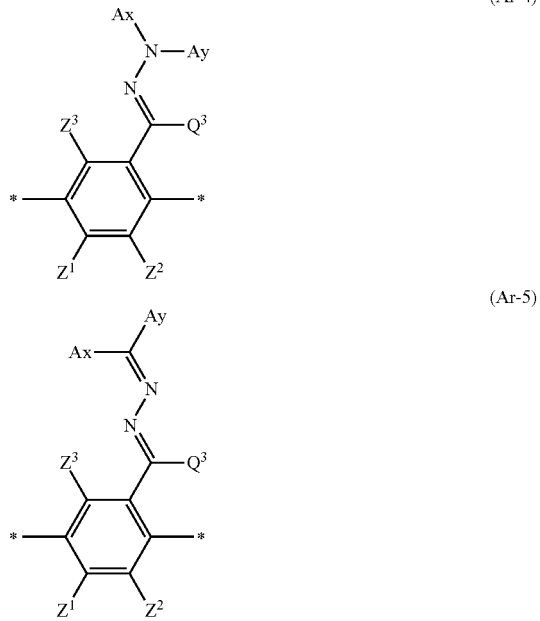

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, which may have a substituent.

Specific examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include an aryl group such as a phenyl group, a 2,6-diethylphenyl group, and a naphthyl group.

Examples of the aromatic heterocyclic group having 3 to 12 carbon atoms represented by $Y^1$ include a heteroaryl group such as a thienyl group, a thiazolyl group, a furyl group, and a pyridyl group.

In addition, examples of the substituent which may be contained in $Y^1$ include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among these, the fluorine atom or the chlorine atom is preferable.

Moreover, in Formulae (Ar-1) to (Ar-5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, $R^6$ to $R^9$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadienyl group; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms represented by each of $R^6$ to $R^8$ include a methyl group, an ethyl group, a propyl group, an isopropyl group, an n-butyl group, an isobutyl group, a sec-butyl group, a tert-butyl group, an n-pentyl group, and an n-hexyl group.

Moreover, in Formula (Ar-2) and (Ar-3), $A^3$ and $A^4$ each independently represent a group selected from the group consisting of —O—, —N($R^{10}$)—, —S—, and —CO—, and $R^{10}$ represents a hydrogen atom or a substituent.

Examples of the substituent represented by $R^{10}$ include the same ones as the substituents which may be contained in $Y^1$ in Formula (Ar-1).

Furthermore, in Formula (Ar-2), X represents a hydrogen atom or a non-metal atom of Groups 14 to 16 to which a substituent may be bonded.

In addition, examples of the non-metal atom of Groups 14 to 16 represented by X include an oxygen atom, a sulfur atom, a nitrogen atom having a substituent, and a carbon atom having a substituent, and specific examples of the substituent include an alkyl group, an alkoxy group, an alkyl substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^5$ and $D^6$ each independently represent a single bond, —CO—O—, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (Ar-3), $SP^3$ and $SP^4$ each independently represent a single bond, a linear or branched alkylene group having 1 to 12 carbon atoms, or a divalent linking group in which one or more of —$CH_2$-'s constituting the linear or branched alkylene group having 1 to 12 carbon atoms are substituted with —O—, —S—, —NH—, —N(Q)-, or —CO—, and Q represents a substituent. Examples of the substituent include the same ones as the substituents which may be contained in $Y^1$ in Formula (Ar-1).

Furthermore, in Formula (Ar-3), $L^3$ and $L^4$ each independently represent a monovalent organic group, and at least one of $L^3$ or $L^4$, or $L^1$ or $L^2$ in Formula (3) represents a polymerizable group.

Examples of the monovalent organic group include the same ones as the monovalent organic groups described in $L^1$ and $L^2$ in Formula (3).

In addition, examples of the polymerizable group include the same ones as the polymerizable groups described in $L^1$ and $L^2$ in Formula (3).

Moreover, in Formulae (Ar-4) to (Ar-5), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-5), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom, or an alkyl group having 1 to 6 carbon atoms, which may have a substituent. Examples of Ax and Ay include those described in paragraphs [0039] to [0095] of WO2014/010325A.

Furthermore, specific examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

Preferred examples of the liquid crystal compound represented by Formula (3) are shown below, but are not limited to these liquid crystal compounds. Further, the 1,4-cyclohexylene groups in the following formulae are all trans-1,4-cyclohexylene groups

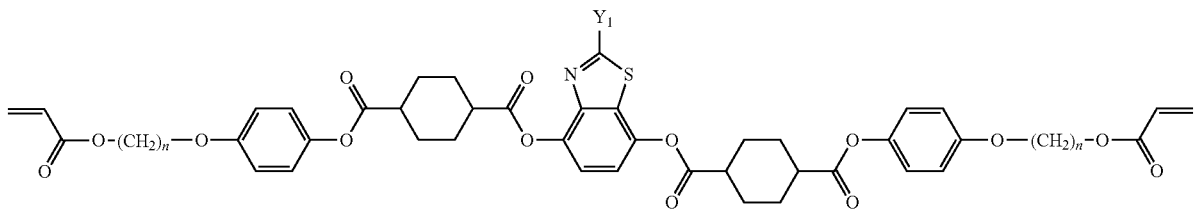
| No | Y1 | n |
|---|---|---|
| II-1-1 | phenyl* | 6 |
| II-1-2 | 4-CH-phenyl* | 6 |
| II-1-3 | 4-NO₂-phenyl* | 6 |
| II-1-4 | pyridin-4-yl* | 6 |
| II-1-5 | 4-(styryl)phenyl* | 6 |
| II-1-6 | 4-NO₂-phenyl* | 11 |
-continued
| No | Y1 | n |
|---|---|---|
| II-1-7 | 4-NO₂-phenyl* | 8 |
| II-1-8 | 4-NO₂-phenyl* | 4 |
| II-1-9 | thiophen-2-yl* | 6 |
| II-1-10 | 2-methyl-4-NO₂-phenyl* | 6 |
| II-1-11 | 4,6-dimethylbenzofuran-2-yl* | 6 |
| II-1-12 | furan-2-yl* | 6 |

19
-continued
| No | Y1 | n |
|---|---|---|
| II-1-13 | 5-chloro-thiophen-2-yl * | 6 |
| II-1-14 | thiazol-5-yl * | 6 |
| II-1-15 | 4-(methylsulfonyl)phenyl * (SO₂CH₃) | 6 |
20
| No | X | R1 |
|---|---|---|
| II-2-1 | NC–CH(*)–CN | H |
| II-2-2 | NC–CH(*)–C(O)OCH₃ | H |
| II-2-3 | NC–CH(*)–C(O)O-butyl | H |
| II-2-4 | NC–CH(*)–C(O)OCH₂CH₂OC(CH₃)₂OH | H |
| II-2-5 | NC–CH(*)–CN | CH₃ |
II-1-16
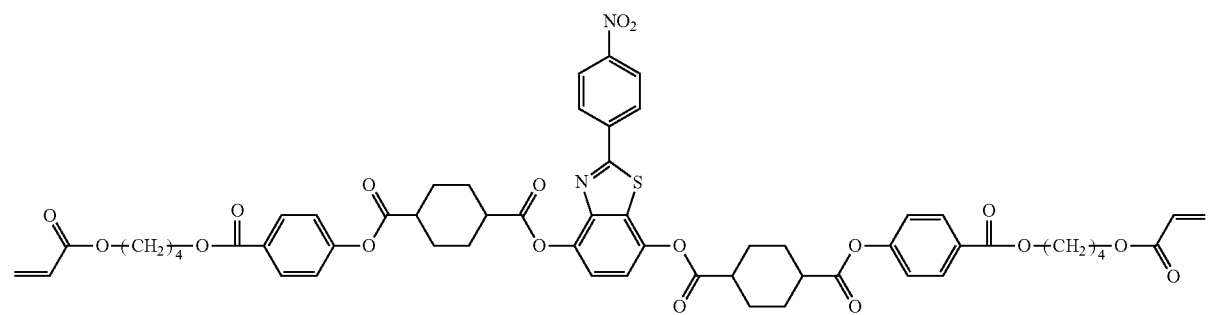
II-1-17
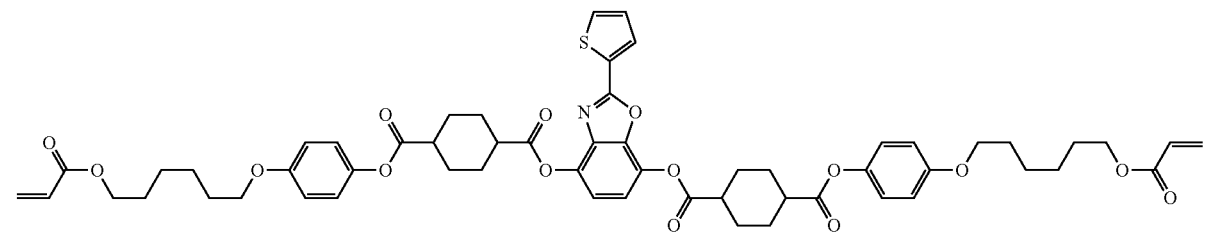
II-1-18
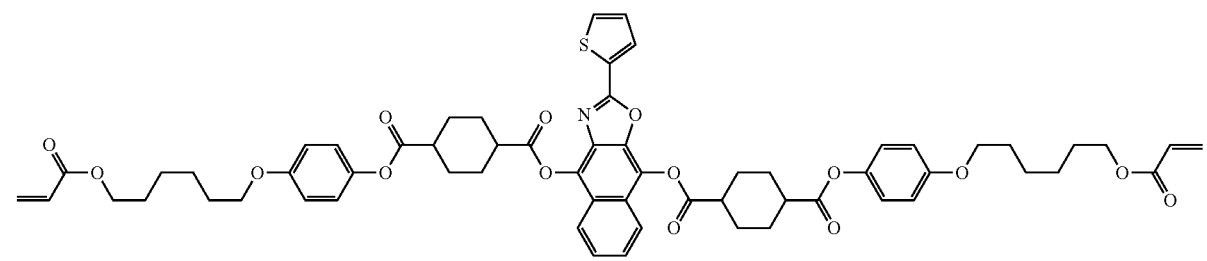

-continued

| No | X | R1 |
|---|---|---|
| II-2-6 | NC-CH(*)-CN | -C(CH$_3$)$_3$ |
| II-2-7 | S | H |

In addition, in the formulae, "*" represents a bonding position.

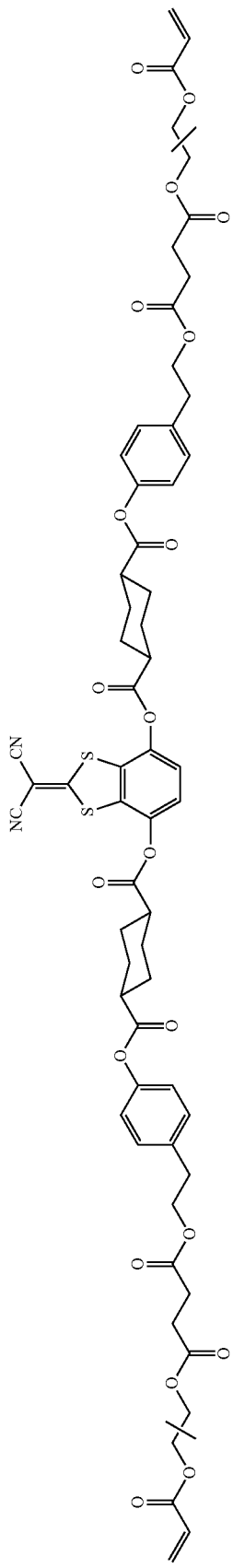
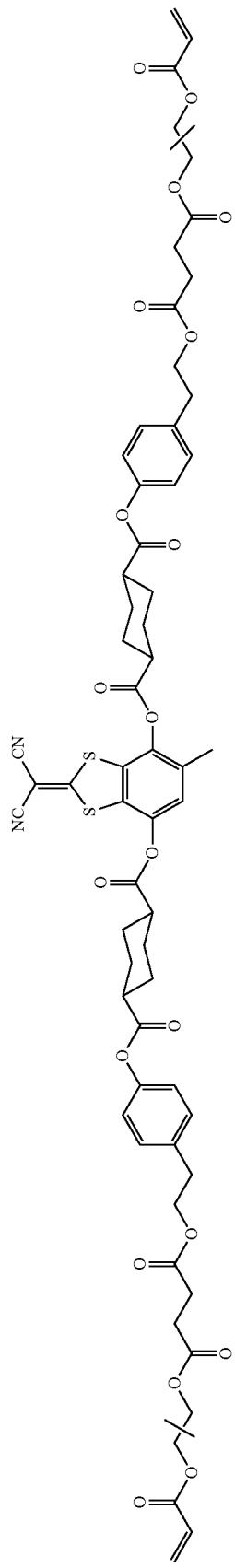

In addition, a group adjacent to the acryloyloxy group in Formulae II-2-8 and II-2-9 represents a propylene group (a group in which a methyl group is substituted with an ethylene group), and a mixture of positional isomers in which the positions of the methyl groups are different.

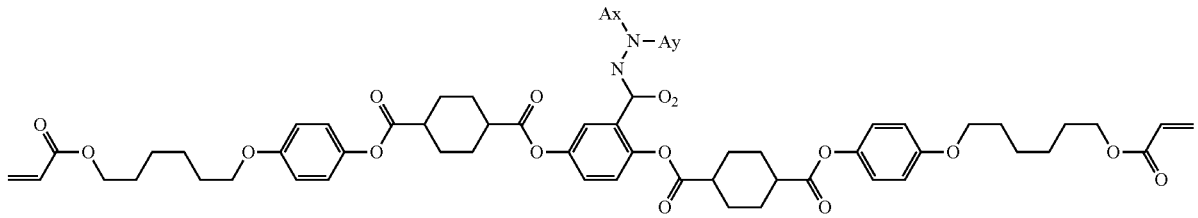

| No | Ax | Ay | Q2 |
|---|---|---|---|
| II-3-1 | benzothiazol-2-yl | H | H |
| II-3-2 | benzoxazol-2-yl | H | H |
| II-3-3 | naphthalen-1-yl | H | H |
| II-3-4 | Ph | Ph | H |
| II-3-5 | quinolin-2-yl | H | H |
| II-3-6 | phthalazin-1-yl | H | H |
| II-3-7 | benzothiazol-2-yl | $CH_3$ | H |
| II-3-8 | benzothiazol-2-yl | $C_4H_9$ | H |
| II-3-9 | benzothiazol-2-yl | $C_6H_9$ | H |
| II-3-10 | benzothiazol-2-yl | acryloyl | H |

-continued

| No | Ax | Ay | Q2 |
|---|---|---|---|
| II-3-11 | benzothiazol-2-yl | benzothiazol-2-yl | H |
| II-3-12 | benzothiazol-2-yl | $CH_2CN$ | H |
| II-3-13 | benzothiazol-2-yl | cyclohexyl | H |
| II-3-14 | benzothiazol-2-yl | isobutyl | H |
| II-3-15 | benzothiazol-2-yl | $CH_2CH_2OH$ | H |
| II-3-16 | fluoren-9-yl | H | H |
| II-3-17 | benzothiazol-2-yl | $CH_3CF_3$ | H |
| II-3-18 | benzothiazol-2-yl | H | $CH_3$ |
| II-3-19 | benzothiazol-2-yl | cyclohexylmethyl | H |
| II-3-20 | benzothiazol-2-yl | $(CH_2)_3CN$ | H |

-continued
| No | Ax | Ay | Q2 |
|---|---|---|---|
| II-3-21 | benzothiazol-2-yl | benzyl | H |
| II-3-22 | benzothiazol-2-yl | 4-methylphenylsulfonyl | H |
| II-3-23 | benzothiazol-2-yl | 2-(2-methoxyethoxy)ethyl | H |
-continued
| No | Ax | Ay | Q2 |
|---|---|---|---|
| II-3-24 | benzothiazol-2-yl | 1-oxobutyl | H |
| II-3-25 | naphtho[1,2-d]thiazol-2-yl | C$_6$H$_{13}$ | H |
II-3-26
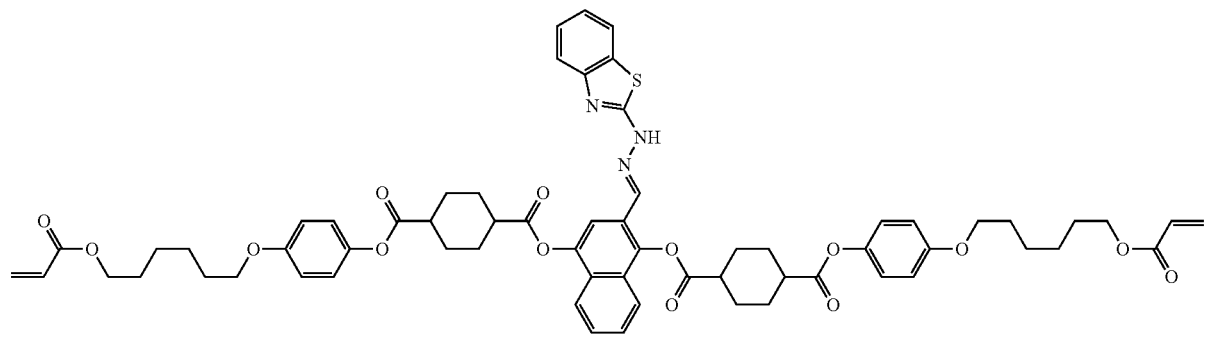
II-3-27
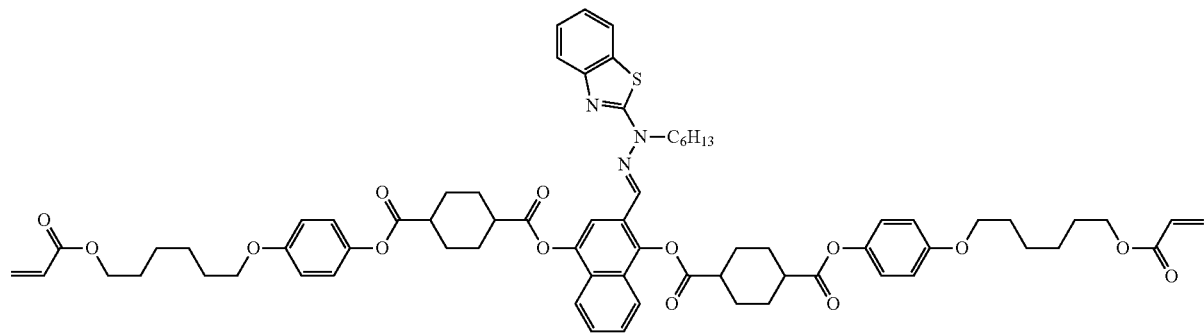
II-3-28
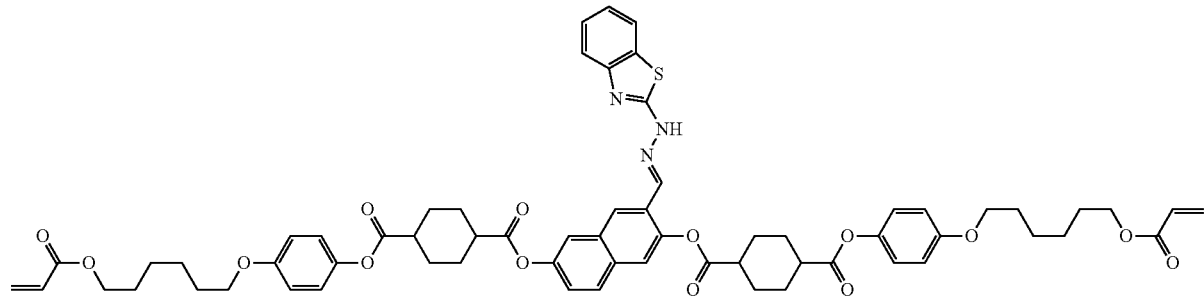

II-3-29
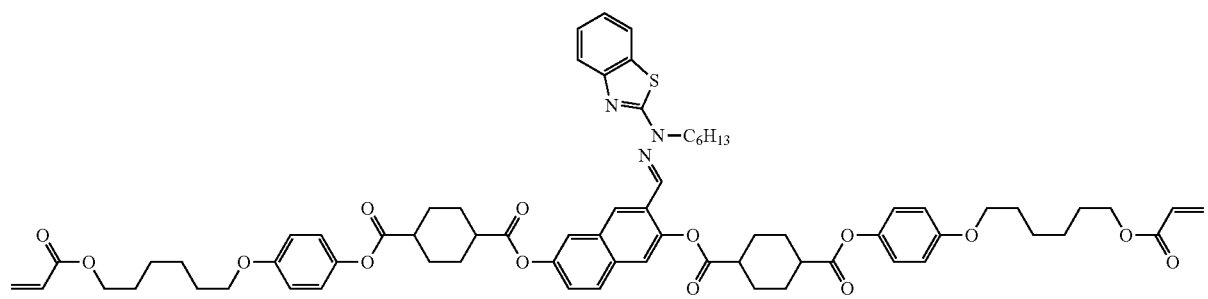
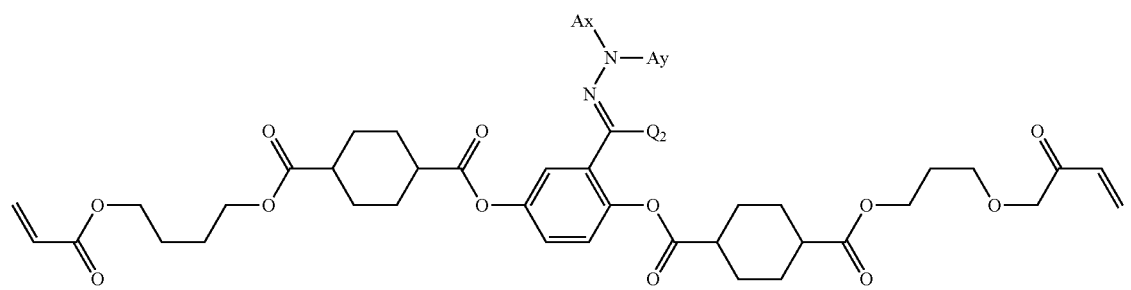
| No | Ax | Ay | Q2 |
|---|---|---|---|
| II-3-30 | benzothiazol-2-yl | H | H |
| II-3-31 | benzoxazol-2-yl | H | H |
| II-3-32 | naphth-1-yl | H | H |
| II-3-33 | Ph | Ph | H |
| II-3-34 | quinolin-2-yl | H | H |
| II-3-35 | phthalazin-1-yl | H | H |
| II-3-36 | benzothiazol-2-yl | CH$_3$ | H |
| II-3-37 | benzothiazol-2-yl | C$_4$H$_9$ | H |
| II-3-38 | benzothiazol-2-yl | C$_6$H$_9$ | H |
| II-3-39 | benzothiazol-2-yl | acryloyl | H |
| II-3-40 | benzothiazol-2-yl | benzothiazol-2-yl | H |
| II-3-41 | benzothiazol-2-yl | CH$_2$CN | H |
| II-3-42 | benzothiazol-2-yl | cyclohexyl | H |
| II-3-43 | benzothiazol-2-yl | isobutyl | H |

-continued

| No | Ax | Ay | Q2 |
|---|---|---|---|
| II-3-44 | benzothiazol-2-yl | CH₂CH₂OH | H |
| II-3-45 | fluoren-9-yl | H | H |
| II-3-46 | benzothiazol-2-yl | CH₃CF₃ | H |
| II-3-47 | benzothiazol-2-yl | H | CH₃ |
| II-3-48 | benzothiazol-2-yl | cyclohexylmethyl | H |
| II-3-49 | benzothiazol-2-yl | *-CH₂CH₂CH₂-CN | H |

-continued

| No | Ax | Ay | Q2 |
|---|---|---|---|
| II-3-50 | benzothiazol-2-yl | benzyl | H |
| II-3-51 | benzothiazol-2-yl | tosyl (p-tolylsulfonyl) | H |
| II-3-52 | benzothiazol-2-yl | *-CH₂-O-CH₂CH₂-O-CH₃ | H |
| II-3-53 | benzothiazol-2-yl | *-C(O)-CH₂CH₂CH₃ | H |
| II-3-54 | naphtho[1,2-d]thiazol-2-yl | C₆H₁₃ | H |

II-3-55

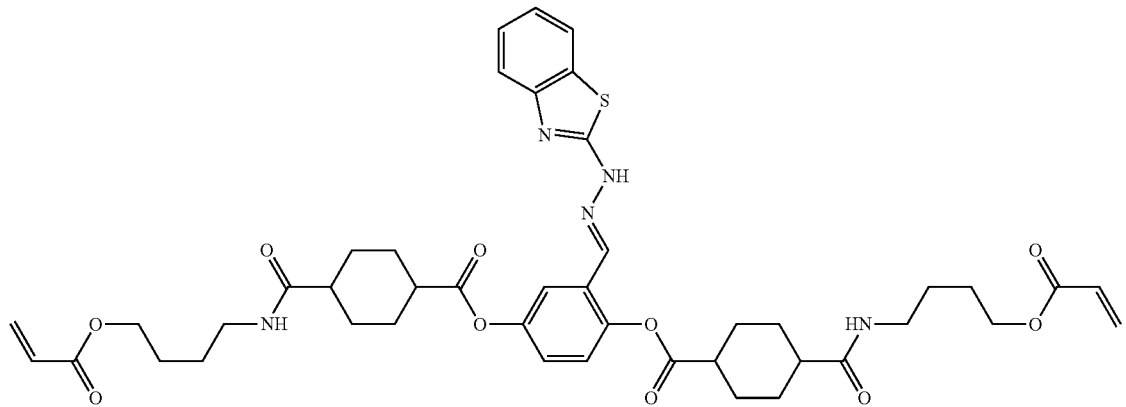

II-4-1

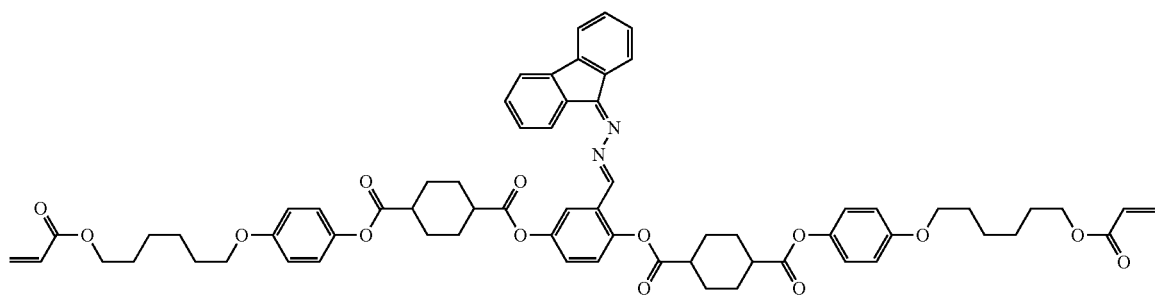

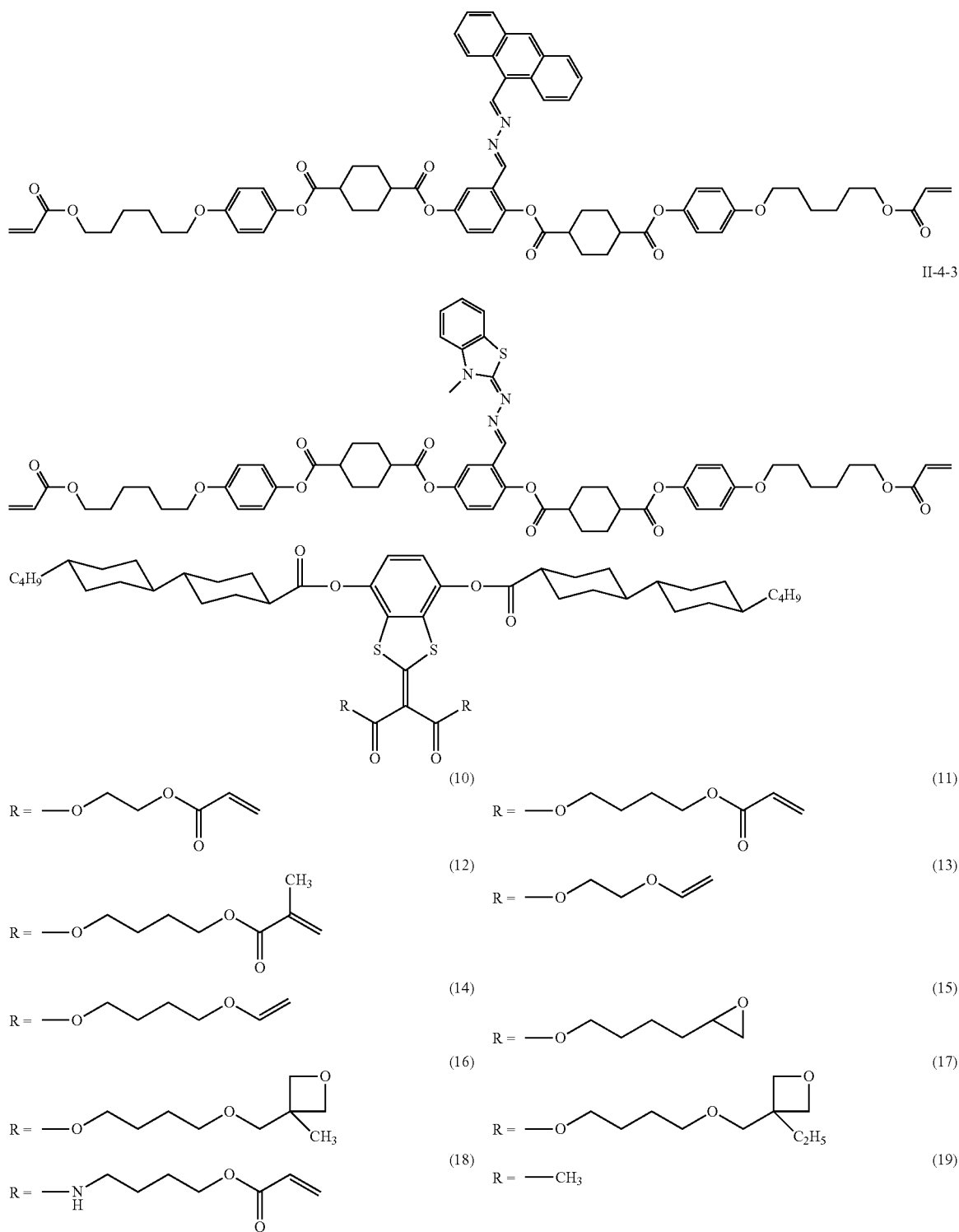

In the present invention, for a reason that the reciprocal wavelength dispersion is further improved, the liquid crystal compound represented by Formula (3) is preferably a liquid crystal compound in which $A^1$ and $A^2$ in Formula (3) are each independently a cycloalkane ring having 6 or more carbon atoms, and more preferably a liquid crystal compound in which $A^1$ and $A^2$ in Formula (3) each independently represent a cycloalkane ring having 6 or more carbon atoms and $D^3$ and $D^4$ in Formula (3) both represent a single bond.

Suitable examples of these liquid crystal compounds include compounds represented by Formulae (3-1) to (3-12), and specifically the compounds having side chain structures shown in Tables 1 and 2 below as K (side chain structure) in Formulae (3-1) to (3-12).

In addition, in Tables 1 and 2 below, "*" shown in the side chain structure of K represents a bonding position to the aromatic ring.

In addition, in the side chain structures shown in 1-2 in Table 1 below and 2-2 in Table 2 below, each of groups adjacent to the acryloyloxy group and the methacryloyl group represents a propylene group (a group in which a methyl group is substituted with an ethylene group), and a mixture of positional isomers in which the positions of the methyl groups are different.

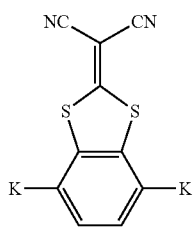
(3-1)

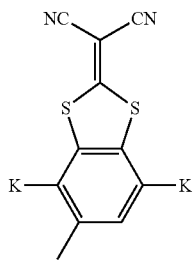
(3-2)

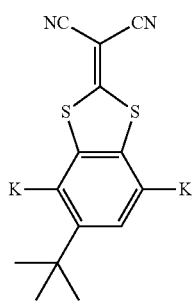
(3-3)

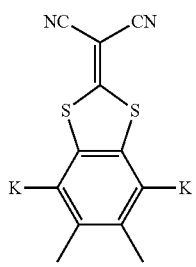
(3-4)

-continued

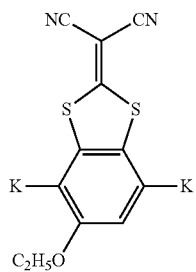
(3-5)

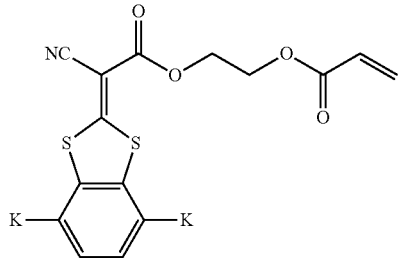
(3-6)

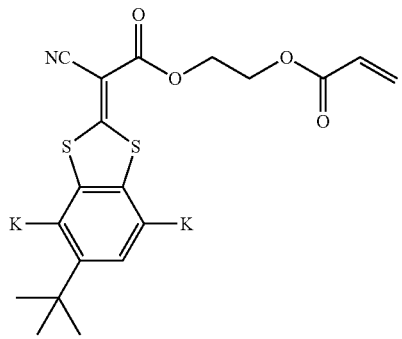
(3-7)

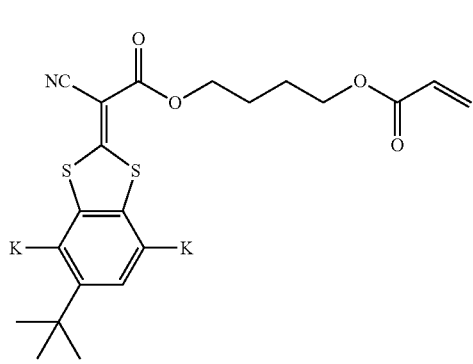
(3-8)

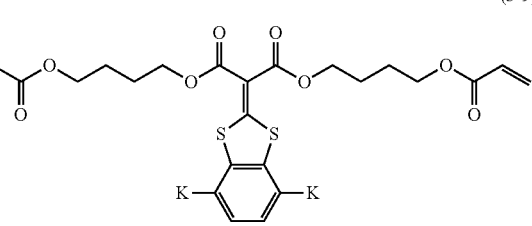
(3-9)

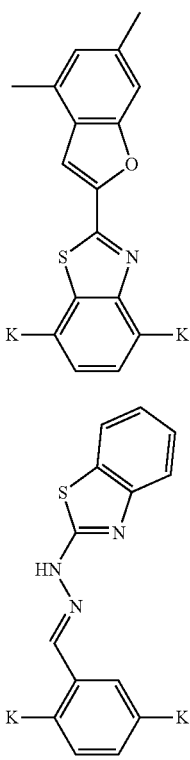
(3-10)
(3-11)
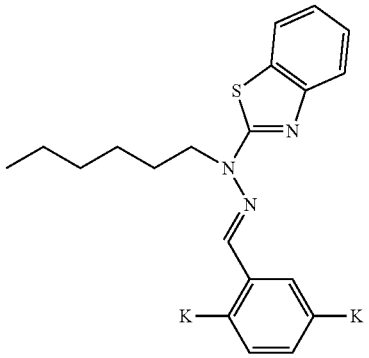
(3-12)
TABLE 1
| | K (Side chain structure) |
|---|---|
| 1-1 | 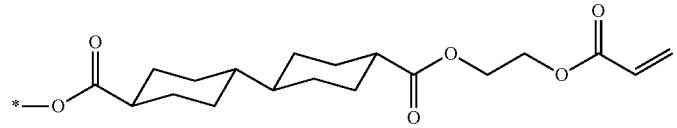 [SMILES: *OC(=O)C1CCC(C2CCC(C(=O)OCCOC(=O)C=C)CC2)CC1] |
| 1-2 | 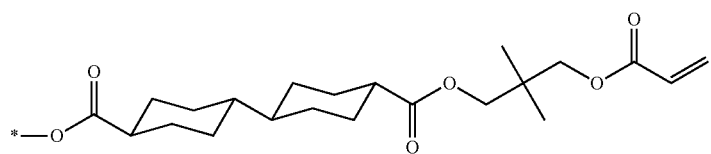 [SMILES: *OC(=O)C1CCC(C2CCC(C(=O)OCC(C)(C)COC(=O)C=C)CC2)CC1] |
| 1-3 | 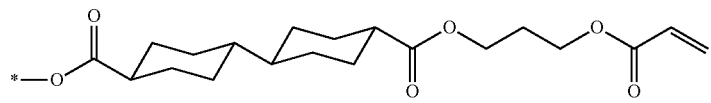 [SMILES: *OC(=O)C1CCC(C2CCC(C(=O)OCCCOC(=O)C=C)CC2)CC1] |
| 1-4 | 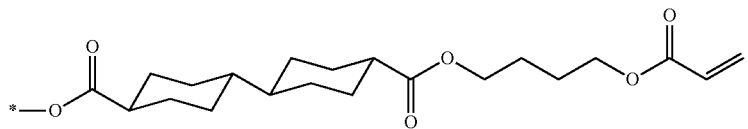 [SMILES: *OC(=O)C1CCC(C2CCC(C(=O)OCCCCOC(=O)C=C)CC2)CC1] |
| 1-5 | 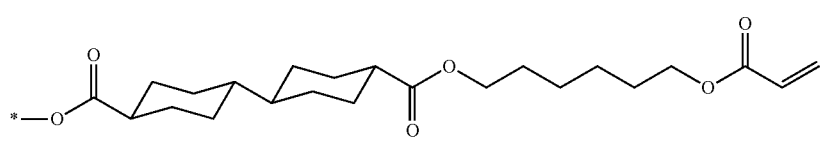 [SMILES: *OC(=O)C1CCC(C2CCC(C(=O)OCCCCCCOC(=O)C=C)CC2)CC1] |

TABLE 1-continued

| | K (Side chain structure) |
|---|---|
| 1-6 | (structure) |
| 1-7 | (structure) |
| 1-8 | (structure) |
| 1-9 | (structure) |
| 1-10 | (structure) |
| 1-11 | (structure) |
| 1-12 | (structure) |
| 1-13 | (structure) |

TABLE 2

| | K (Side chain structure) |
|---|---|
| 2-1 | (structure) |
| 2-2 | (structure) |

TABLE 2-continued

| | K (Side chain structure) |
|---|---|
| 2-3 | |
| 2-4 | |
| 2-5 | |
| 2-6 | |
| 2-7 | |
| 2-8 | |
| 2-9 | |
| 2-10 | |
| 2-11 | |
| 2-12 | |

TABLE 2-continued

K (Side chain structure)

2-13

<Polymerizable Compound>

The specific composition used for the formation of the phase difference layer may include a polymerizable compound, in addition to the above-mentioned liquid crystalline compound having reciprocal wavelength dispersion.

Here, the polymerizable group contained in the polymerizable compound is not particularly limited, and examples thereof include an acryloyl group, a methacryloyl group, a vinyl group, a styryl group, and an allyl group. Among these, the acryloyl group or the methacryloyl group is preferably contained.

For a reason that the light resistance of a phase difference layer formed is further improved, the polymerizable compound is preferably another polymerizable compound having 2 to 4 polymerizable groups, and more preferably another polymerizable compound having 2 polymerizable groups.

Examples of such another polymerizable compound include the compounds represented by Formulae (M1), (M2), and (M3) described in paragraphs [0030] to [0033] of JP2014-077068A, and more specifically, specific examples of the polymerizable compound include the compounds described in paragraphs [0046] to [0055] of the same publication.

<Polymerization Initiator>

The specific composition used for the formation of a phase difference layer preferably contains a polymerization initiator.

As the polymerization initiator used, a photopolymerization initiator capable of initiating a polymerization reaction by irradiation with ultraviolet rays (UV) is preferable.

Examples of the photopolymerization initiator include α-carbonyl compounds (described in each of the specifications of U.S. Pat. Nos. 2,367,661A and 2,367,670A), acyloin ethers (described in U.S. Pat. No. 2,448,828A), aromatic acyloin compounds substituted with α-hydrocarbon (described in U.S. Pat. No. 2,722,512A), polynuclear quinone compounds (described in each of the specifications of U.S. Pat. Nos. 3,046,127A and 2,951,758A), a combination of a triarylimidazole dimer and a p-aminophenyl ketone (described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acylphosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

<Solvent>

It is preferable that the specific composition used for the formation of a phase difference layer contains a solvent from the viewpoints of workability for forming a phase difference layer, and the like.

Specific examples of the solvent include ketones (for example, acetone, 2-butanone, methyl isobutyl ketone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

The phase difference plate of the embodiment of the present invention has a phase difference layer formed from the above-mentioned specific composition. In addition, a method for forming the phase difference layer will be described in detail with reference to the method for producing a phase difference plate of an embodiment of the present invention which will be described later.

In the present invention, the content of the specific polymer in the phase difference layer is preferably 5% to 40% by mass, more preferably 5% to 30% by mass, and still more preferably 5% to 20% by mass. In addition, the specific polymers may be used singly or in combination of two or more kinds thereof. In a case where two or more kinds of the specific polymers are used in combination, it is preferable that the total amount thereof satisfies the content.

In addition, the content of the polymerizable liquid crystal compound having reciprocal wavelength dispersion in the phase difference layer is preferably 50% to 99% by mass, more preferably 60% to 97% by mass, and still more preferably 70% to 95% by mass. Further, the polymerizable liquid crystal compounds having reciprocal wavelength dispersion may be used singly or in combination of two or more kinds thereof. In a case where two or more kinds of the polymerizable liquid crystal compounds having reciprocal wavelength dispersion are used in combination, it is preferable that the total amount thereof satisfies the content.

Furthermore, in the present invention, the thickness of the phase difference layer is not particularly limited, but is preferably 10 μm or less, and more preferably 5 μm or less. The lower limit of the thickness is not particularly limited, but is generally 10 nm or more, and preferably 50 nm or more.

In addition, the phase difference layer is preferably a monolayer structure.

In the present invention, for a reason that a black tint viewing angle is improved, it is preferable that the phase difference layer satisfies Formula (I).

$$Re(450) \leq Re(550) \leq Re(650) \quad \text{(I)}$$

Here, in Formula (I), Re(450) represents an in-plane retardation value measured at a wavelength of 450 nm, Re(550) represents an in-plane retardation value measured at a wavelength of 550 nm, and Re(650) represents an in-plane retardation value measured at a wavelength of 650 nm.

Further, in the present specification, the measurement wavelength is defined as 550 nm unless the measurement wavelength for retardation value is otherwise specified.

In addition, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (μm)) to AxoScan OPMF-1, it is possible to calculate:

Slow axis direction (°)

$Re(\lambda)=R0(\lambda)$ $Rth(\lambda)=((nx+ny)/2-nz)\times d$.

In addition, $R0(\lambda)$ is expressed in a numerical value calculated with AxoScan OPMF-1, but means $Re(\lambda)$.

Moreover, in the present invention, for a reason that linearly polarized light at a wavelength of 550 nm having high human visual sensitivity is accurately converted to circularly polarized light, the Re(550) of the phase difference layer is preferably 100 to 180 nm, and more preferably 120 to 150 nm.

Furthermore, in the present invention, for a reason that the black tint in the oblique direction is good, the Rth(550) of the phase difference layer is preferably −10 to 10 nm, and more preferably −5 to 5 nm.

In addition, in the present invention, for a reason that 120 to 150 nm of the Re(550) and −5 to 5 nm of the Rth(550) are both satisfied, it is preferable that the phase difference layer satisfies a refractive index relationship represented by Formula (II).

$$nx>nz>ny \quad (II)$$

Here, in Formula (II) and Formula (III) which will be described later, nx is a refractive index in a direction in which a refractive index is maximum in a plane (slow axis), ny is a refractive index in a direction in which a refractive index is minimum in a plane (fast axis), and nz represents a refractive index in a thickness direction perpendicular to nx and ny.

In addition, the refractive indices nx, ny, and nz are measured using an Abbe refractometer (NAR-4T, manufactured by Atago Co., Ltd.) and a sodium lamp ($\lambda$=589 nm) as a light source. In addition, in a case of measuring wavelength dependency, the wavelength dependency can be measured with a multi-wavelength Abbe refractometer DR-M2 (manufactured by Atago Co., Ltd.) in combination with an interference filter.

Moreover, in the present invention, for a reason that 120 to 150 nm of the Re(550) and −5 to 5 nm of the Rth(550) are both satisfied, it is preferable that the phase difference layer satisfies a refractive index relationship represented by Formula (III).

$$0.4<(nx-nz)/(nx-ny)<0.6 \quad (III)$$

[Transparent Support]

The phase difference plate of the embodiment of the present invention may have a transparent support that supports the above-mentioned phase difference layer.

Here, a term "transparent" as mentioned in the present invention indicates that the transmittance of visible light is 60% or more, preferably 80% or more, and particularly preferably 90% or more.

Examples of such a transparent support include a glass substrate and a polymer film.

Examples of a material for the polymer film include cellulose-based polymers; acrylic polymers having an acrylic acid ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers containing a mixture of these polymers.

The thickness of the transparent support is not particularly limited, but is preferably 5 to 200 μm, more preferably 10 to 100 μm, and still more preferably 20 to 90 μm.

[Method for Producing Phase Difference Plate]

The method for producing a phase difference plate of the embodiment of the present invention, used for the manufacture of the phase difference plate of the embodiment of the present invention, has an applying step of applying a specific composition containing the above-mentioned specific polymer and a polymerizable liquid crystal compound onto the above-mentioned transparent support to form a coating film, an irradiating step of performing irradiation with polarized ultraviolet rays from a direction perpendicular to the coating film, and a heating step of subjecting the coating film after the irradiating step to a heating treatment to form a phase difference layer.

[Applying Step]

An applying method in the applying step is not particularly limited, and examples thereof include a spin coating method, an air knife coating method, a curtain coating method, a roller coating method, a wire bar coating method, a gravure coating method, and a die coating method.

In addition, the coating amount is preferably controlled such that a phase difference layer having a desired thickness can be produced.

[Irradiating Step]

The irradiating step is a step of irradiating the coating film formed by the applying step with polarized ultraviolet rays from a direction perpendicular to the coating film.

Examples of a method for performing irradiation with polarized ultraviolet rays include a method using a polarizing plate (for example, an iodine polarizing plate, a dichroic dye polarizing plate, and a wire grid polarizing plate); a method using a prism-based element (for example, a Glan-Thompson prism) or a reflection type polarizer utilizing the angle of polarization (Brewstar's angle); and a method using light emitted from a laser light source having polarized light.

A light source used for irradiation with ultraviolet rays is not particularly limited as long as it is a light source that generates ultraviolet rays, and for example, a low-pressure mercury lamp, an intermediate-pressure mercury lamp, a high-pressure mercury lamp, an ultrahigh-pressure mercury lamp, a carbon-arc lamp, a metal halide lamp, a xenon lamp, or the like can be used.

The light irradiation dose is preferably 300 to 30,000 mJ/cm$^2$, and more preferably 500 to 15,000 mJ/cm$^2$.

By controlling the light irradiation dose to change the alignment state of the photo-alignment group in the repeating unit A contained in the specific polymer, it is possible to control an Nz factor, that is, (nx-nz)/(nx-ny) of the phase difference layer.

[Heating Step]

The heating step is a step of subjecting the coating film after the irradiating step to a heating treatment to form a phase difference layer.

In the present invention, the heating temperature in the heating step is preferably 50° C. or higher, more preferably 100° C. to 200° C., and still more preferably 120° C. to 180° C.

In addition, the heating time is preferably 30 seconds to 10 minutes, more preferably 1 minute to 10 minutes, and still more preferably 2 minutes to 8 minutes.

[Organic EL Display Device]

The organic EL display device of an embodiment of the present invention has the phase difference plate of the embodiment of the present invention and an organic EL light emitting element.

Suitable examples of such an organic EL display device include an aspect of an organic EL display panel which has a polarizer, the phase difference plate of the embodiment of the present invention, and an organic EL display panel in this order from the viewing side.

[Polarizer]

The polarizer is not particularly limited as long as it is a member having a function of converting light into specific linearly polarized light, and an absorption type polarizer and a reflection type polarizer, which are known in the related art, can be used.

An iodine-based polarizer, a dye-based polarizer using a dichroic dye, a polyene-based polarizer, or the like is used as the absorption type polarizer. As the iodine-based polarizer and the dye-based polarizer, there are a coating type polarizer and a stretching type polarizer, both of which can be applied, but a polarizer prepared by allowing polyvinyl alcohol to adsorb iodine or a dichroic dye and performing stretching is preferable.

In addition, examples of a method for obtaining a polarizer by performing stretching and dyeing in a state of a laminated film in which a polyvinyl alcohol layer is formed on a base material include the methods disclosed in JP5048120B, JP5143918B, JP4691205B, JP4751481B, and JP4751486B, and known technologies related to these polarizers can also be preferably used.

A polarizer in which thin films having different birefringence are laminated, a wire grid type polarizer, a polarizer in which a cholesteric liquid crystal having a selective reflection range and a ¼ wavelength plate are combined, or the like is used as the reflection type polarizer.

Among these, from the viewpoint that the adhesiveness is more excellent, a polarizer including a polyvinyl alcohol-based resin (a polymer including —CH$_2$—CHOH— as a repeating unit, in particular, at least one selected from the group consisting of polyvinyl alcohol and an ethylene-vinyl alcohol copolymer) is preferable.

The thickness of the polarizer is not particularly limited, but is preferably 3 μm to 60 μm, more preferably 5 μm to 30 μm, and still more preferably 5 μm to 15 μm.

[Organic EL Display Panel]

The organic EL display panel is a member which forms a light emitting layer or a plurality of organic compound thin films including the light emitting layer between a pair of electrodes, that is, an anode and a cathode, and may have a hole injecting layer, a hole transporting layer, an electron injecting layer, an electron transporting layer, a protective layer, or the like, in addition to the light emitting layer, and each of these layers may comprise different functions. Each of various materials can be used to form each of the layers.

EXAMPLES

Hereinafter, the present invention will be described in more detail with reference to Examples. The materials, the amounts to materials used, the ratios, the treatment details, the treatment procedure, and the like shown in the following Examples can be modified as appropriate while not departing from the spirit of the present invention. Therefore, the scope of the present invention should not be restrictively interpreted by the following Examples.

Example 1

[Manufacture of Phase Difference Plate 1 Having Reciprocal Wavelength Dispersion]

<Preparation of Composition 1 for Phase Difference Layer 1>

The following composition was dissolved to prepare a composition 1 for a phase difference layer 1.

| Composition 1 for phase difference layer 1 | |
|---|---|
| The following polymer P-1 | 4 parts by mass |
| The following polymerizable liquid crystal compound L-1 | 16 parts by mass |
| Chloroform | 80 parts by mass |

P-1

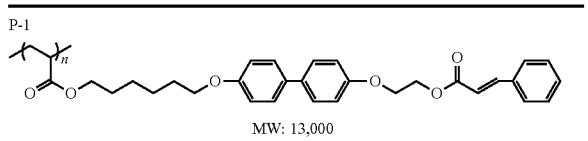

MW: 13,000

L-1

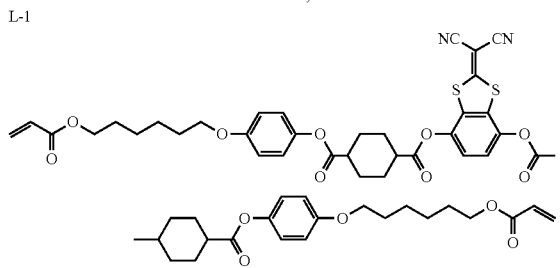

<Manufacture of Phase Difference Layer 1>

The composition 1 for a phase difference layer 1 was applied onto a glass substrate using a spin coater, and the film was dried and then irradiated with ultraviolet rays in the atmosphere using an air-cooling metal halide lamp (manufactured by Eyegraphics Co., Ltd.) from the coating surface side. At this time, a wire grid polarizer (ProFlux PPL02, manufactured by Moxtek, Inc.) was set to be in parallel with the coating surface and exposure was performed from a direction perpendicular to the coating surface. In addition, the illuminance of ultraviolet rays used herein was set to 100 mW/cm$^2$ in the UV-A region (integration at the wavelengths of 380 nm to 320 nm) and the irradiation dose was set to 1,000 mJ/cm$^2$ in the UV-A region.

Subsequently, the coating film was heated at 150° C. to 5 minutes and then cooled to room temperature (23° C.) to manufacture a phase difference plate 1. The film thickness of the obtained phase difference layer 1 was 3.5 μm.

Example 2

[Manufacture of Phase Difference Plate 2 Having Reciprocal Wavelength Dispersion]

A phase difference plate 2 of Example 2 was manufactured by the same method as in Example 1, except that the following polymerizable liquid crystal compound L-2 was used instead of the polymerizable liquid crystal compound L-1. The film thickness of the phase difference layer was 3.5 µm.

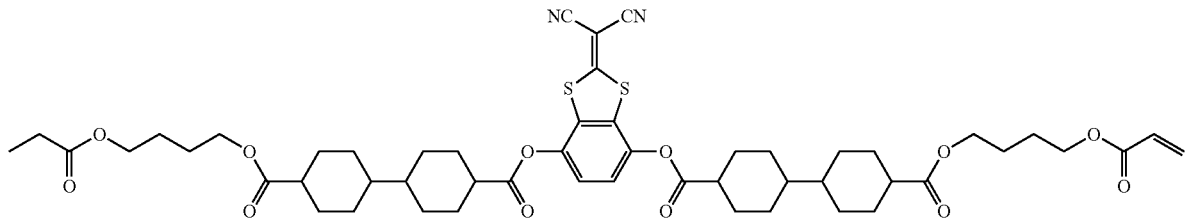

L-2

Example 3

[Manufacture of Phase Difference Plate 3 Having Reciprocal Wavelength Dispersion]

A phase difference plate 3 of Example 3 was manufactured by the same method as in Example 2, except that a polymer P-2 was used instead of the polymer P-1. The film thickness of the phase difference layer was 3.5 µm.

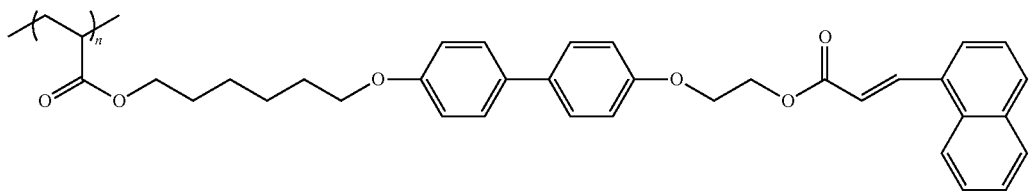

P-2

MW: 12,500

Example 4

[Manufacture of Phase Difference Plate 4 Having Reciprocal Wavelength Dispersion]

A phase difference plate 4 of Example 4 was manufactured by the same method as in Example 2, except that a polymer P-3 was used instead of the polymer P-1. The film thickness of the phase difference layer was 3.5 µm.

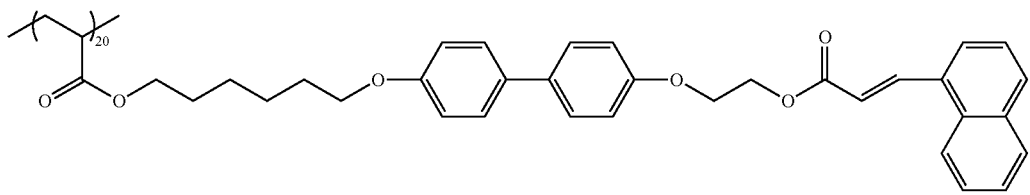

P-3

MW: 12,500

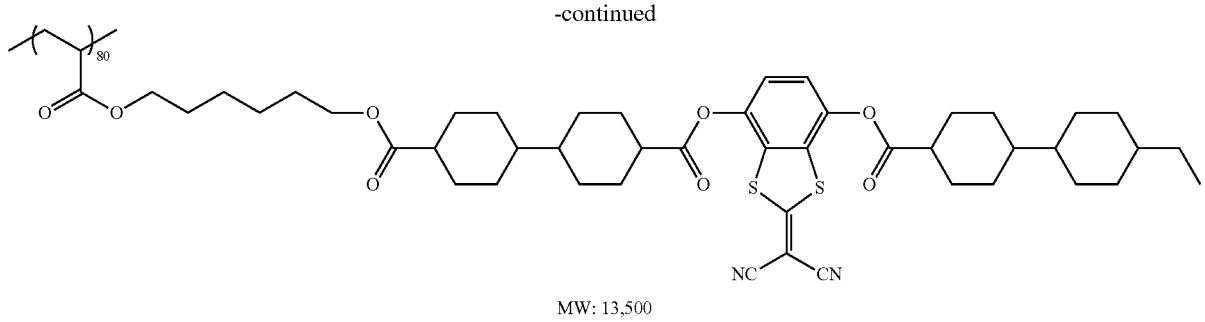

MW: 13,500

Comparative Example 1

[Manufacture of Phase Difference Plate 5 Having Forward Wavelength Dispersion]

A phase difference plate 5 of Comparative Example 1 was manufactured by the same method as in Example 1, except that 19 parts by mass of the following high molecular compound 1 described in Example 1 of JP2016-080942A was used instead of the polymer P-1, 1 part by mass of the following rod-like liquid crystal compound 1 described in Example 1 of JP2016-080942A was used instead of the polymerizable liquid crystal compound L-1, and heating after the irradiation was not performed. The film thickness of the phase difference layer was adjusted to 1.0 μm.

High molecular compound 1 (weight-average molecular weight: 24,000)

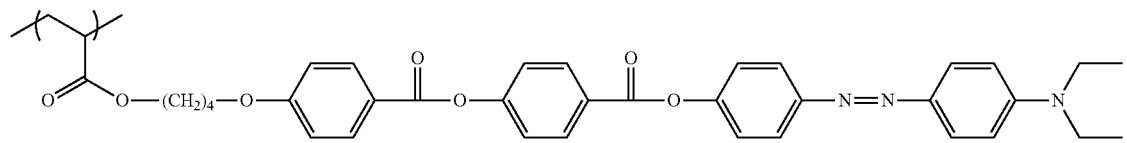

Rod-Like Liquid Crystal Compound 1

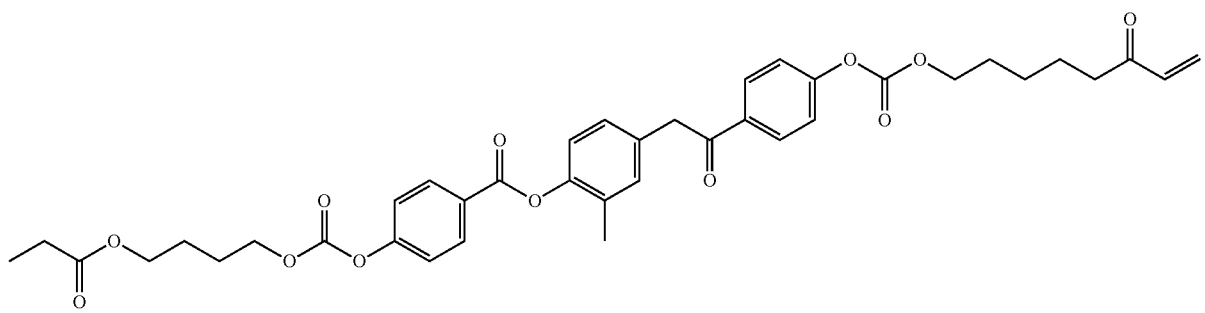 [SMILES: C=CC(=O)CCCCCOC(=O)Oc1ccc(C(=O)Cc2ccc(OC(=O)c3ccc(OC(=O)OCCCCOC(=O)CC)cc3)c(C)c2)cc1]

[Evaluation]
<Optical Characteristics>

With regard to each of the phase difference plates manufactured in Examples and Comparative Examples as described above, Re(550), Rth(550), Re(450)/Re(550), Re(650)/Re(550), nx, ny, and nz were evaluated by the above-mentioned methods. The evaluation results are shown in Table 3.

<Evaluation of Light Resistance>

With regard to each of the phase difference plates manufactured in Examples and Comparative Examples as described above, xenon light was irradiated from the phase difference plate side through an ultraviolet blocking film at 250,000 Lx for 200 hours under the conditions of 60° C. and a relative humidity of 50%, using a super xenon weather meter (SX-75 manufactured by Suga Test Instruments Co., Ltd.). A change in Re after a lapse of 1 hour in a dark place at room temperature was measured. The evaluation results are shown in Table 3.

A: The change in Re is less than 5%.
B: The change in Re is 5% or more and less than 20%.
C: The change in Re is 20% or more.

TABLE 3

| | Polymer | Polymerizable liquid crystal compound | Re (nm) | Rth (nm) | Re (450)/ Re (550) | Re (650)/ Re (550) | Refractive index | | | (nx − nz)/(nx − ny) | Light resistance |
| --- | --- | --- | --- | --- | --- | --- | --- | --- | --- | --- | --- |
| | | | | | | | nx | ny | nz | | |
| Example 1 | P-1 | L-1 | 155 | 0 | 0.90 | 1.01 | 1.56 | 1.52 | 1.54 | 0.5 | A |
| Example 2 | P-1 | L-2 | 105 | 0 | 0.80 | 1.05 | 1.55 | 1.52 | 1.54 | 0.5 | A |
| Example 3 | P-2 | L-2 | 140 | 0 | 0.85 | 1.03 | 1.56 | 1.52 | 1.54 | 0.5 | A |
| Example 4 | P-3 | L-2 | 105 | 0 | 0.80 | 1.05 | 1.55 | 1.52 | 1.54 | 0.5 | A |
| Comparative Example 1 | High molecular compound 1 | Rod-like liquid crystal compound 1 | 120 | 0 | 1.22 | 0.96 | 1.66 | 1.54 | 1.60 | 0.5 | C |

From the results shown in Table 3, it could be seen that in a case of using a phase difference layer formed from a composition containing a polymer having a repeating unit A including an azo group as a photo-alignment group, birefringent properties and biaxial properties are expressed upon irradiation with polarized light, but the wavelength dispersion is forward dispersibility and the light resistance is also poor (Comparative Example 1).

In contrast, it could be seen that in a case of using a phase difference layer formed from a composition containing a polymer having a repeating unit A including a photo-alignment group including a double bond structure of C=C or C=N and a polymerizable liquid crystal compound having reciprocal wavelength dispersion, reciprocal wavelength dispersion can be realized in any case (Examples 1 to 4). In addition, it could also be seen that a phase difference layer thus manufactured expresses biaxial birefringent properties, and thus, the light resistance is also excellent.

What is claimed is:

1. A phase difference plate for an organic EL display device, comprising a phase difference layer formed from a composition containing a polymer having a repeating unit A including a photo-alignment group and a polymerizable liquid crystal compound having reciprocal wavelength dispersion,
   wherein the photo-alignment group includes a double bond structure of C=C or C=N.

2. The phase difference plate for an organic EL display device according to claim 1,
   wherein the polymerizable liquid crystal compound having reciprocal wavelength dispersion is a liquid crystal compound represented by Formula (3), $L^1$-$SP^1$-$A^1$-$D^3$-$G^1$-$D^1$-Ar-$D^2$-$G^2$-$D^4$-$A^2$-$SP^2$-$L^2$  (3)

in Formula (3), $D^1$, $D^2$, $D^3$, and $D^4$ each independently represent a single bond, —O—CO—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—, and $R^1$, $R^2$, $R^3$, and $R^4$ each independently represent a hydrogen atom, a fluorine atom, or an alkyl group having 1 to 4 carbon atoms, $G^1$ and $G^2$ each independently represent a divalent alicyclic hydrocarbon group having 5 to 8 carbon atoms, in which one or more of —CH2-'s constituting the alicyclic hydrocarbon group may be substituted with —O—, —S—, or —NH—, $A^1$ and $A^2$ each independently represent an aromatic ring having 6 or more carbon atoms or a cycloalkane ring having 6 or more carbon atoms, $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent, $L^1$ and $L^2$ each independently represent a monovalent organic group, and at least one of $L^1$ or $L^2$ represents a polymerizable group, provided that in a case where Ar is an aromatic ring represented by Formula (Ar-3), at least one of $L^1$ or $L^2$, or $L^3$ or $L^4$ in Formula (Ar-3) represents a polymerizable group, and Ar represents any one aromatic ring selected from the group consisting of groups represented by Formulae (Ar-1) to (Ar-5),

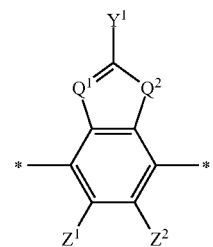

(Ar-1)

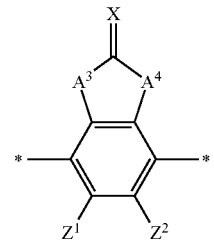

(Ar-2)

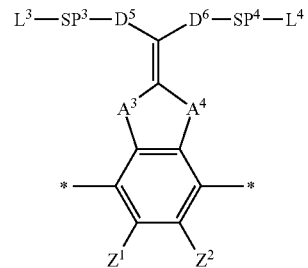

(Ar-3)

-continued

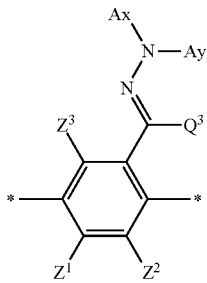

(Ar-4)

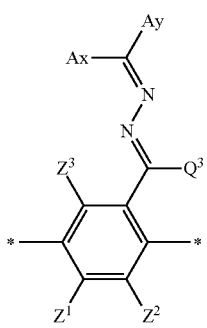

(Ar-5)

in Formulae (Ar-1) to (Ar-5), * represents a bonding position to $D^1$ or $D^2$, $Q^1$ represents N or CH, $Q^2$ represents —S—, —O—, or —N($R^5$)—, and $R^5$ represents a hydrogen atom or an alkyl group having 1 to 6 carbon atoms, $Y^1$ represents an aromatic hydrocarbon group having 6 to 12 carbon atoms or an aromatic heterocyclic group having 3 to 12 carbon atoms, each of which may have a substituent, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, $R^6$ to $R^9$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($R^{10}$)—, —S—, and —CO—, and $R^{10}$ represents a hydrogen atom or a substituent, X represents a hydrogen atom or a non-metal atom of Groups 14 to 16 to which a substituent may be bonded, $D^5$ and $D^6$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—, and $R^1$, $R^2$, $R^3$, and $R^4$ each independently represent a hydrogen atom, a fluorine atom, or an alkyl group having 1 to 4 carbon atoms, $SP^3$ and $SP^4$ each independently represent a single bond, a linear or branched alkylene group having 1 to 12 carbon atoms, or a divalent linking group in which one or more of —CH2-'s constituting the linear or branched alkylene group having 1 to 12 carbon atoms are substituted with —O—, —S—, —NH—, —N(Q)-, or —CO—, and Q represents a substituent, $L^3$ and $L^4$ each independently represent a monovalent organic group, and at least one of $L^3$ or $L^4$, or $L^1$ or $L^2$ in Formula (3) represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom, or an alkyl group having 1 to 6 carbon atoms, which may have a substituent.

3. The phase difference plate for an organic EL display device according to claim 1,
wherein the photo-alignment group is a cinnamate group or a chalcone group.

4. The phase difference plate for an organic EL display device according to claim 2,
wherein the photo-alignment group is a cinnamate group or a chalcone group.

5. The phase difference plate for an organic EL display device according to claim 1,
wherein the polymer is an acrylic or methacrylic polymer.

6. The phase difference plate for an organic EL display device according to claim 2,
wherein the polymer is an acrylic or methacrylic polymer.

7. The phase difference plate for an organic EL display device according to claim 1,
wherein the phase difference layer satisfies Formula (I), $$Re(450) \leq Re(550) \leq Re(650) \qquad (I)$$

in Formula (I), Re(450) represents an in-plane retardation value measured at a wavelength of 450 nm, Re(550) represents an in-plane retardation value measured at a wavelength of 550 nm, and Re(650) represents an in-plane retardation value measured at a wavelength of 650 nm.

8. The phase difference plate for an organic EL display device according to claim 2,
wherein the phase difference layer satisfies Formula (I), $$Re(450) \leq Re(550) \leq Re(650) \qquad (I)$$

in Formula (I), Re(450) represents an in-plane retardation value measured at a wavelength of 450 nm, Re(550) represents an in-plane retardation value measured at a wavelength of 550 nm, and Re(650) represents an in-plane retardation value measured at a wavelength of 650 nm.

9. The phase difference plate for an organic EL display device according to claim 1,
wherein the phase difference layer is a layer indicating an in-plane retardation value measured at a wavelength of 550 nm of 100 to 180 nm.

10. The phase difference plate for an organic EL display device according to claim 2,
wherein the phase difference layer is a layer indicating an in-plane retardation value measured at a wavelength of 550 nm of 100 to 180 nm.

11. The phase difference plate for an organic EL display device according to claim 1,
wherein the phase difference layer is a layer indicating a thickness-direction retardation value measured at a wavelength of 550 nm of −10 to 10 nm.

12. The phase difference plate for an organic EL display device according to claim 2,
wherein the phase difference layer is a layer indicating a thickness-direction retardation value measured at a wavelength of 550 nm of −10 to 10 nm.

13. The phase difference plate for an organic EL display device according to claim 1,
wherein the phase difference layer satisfies a refractive index relationship represented by Formula (II), $$nx>nz>ny \quad \text{(II)}$$

in Formula (II), nx is a refractive index in a direction in which a refractive index is maximum in a plane, ny is a refractive index in a direction in which a refractive index is minimum in a plane, and nz represents a refractive index in a thickness direction perpendicular to nx and ny.

14. The phase difference plate for an organic EL display device according to claim 2,
wherein the phase difference layer satisfies a refractive index relationship represented by Formula (II), $$nx>nz>ny \quad \text{(II)}$$

in Formula (II), nx is a refractive index in a direction in which a refractive index is maximum in a plane, ny is a refractive index in a direction in which a refractive index is minimum in a plane, and nz represents a refractive index in a thickness direction perpendicular to nx and ny.

15. The phase difference plate for an organic EL display device according to claim 1,
wherein the phase difference layer satisfies Formula (III), $$0.4<(nx-nz)/(nx-ny)<0.6 \quad \text{(III)}$$

in Formula (III), nx is a refractive index in a direction in which a refractive index is maximum in a plane, ny is a refractive index in a direction in which a refractive index is minimum in a plane, and nz represents a refractive index in a thickness direction perpendicular to nx and ny.

16. The phase difference plate for an organic EL display device according to claim 1,
wherein the phase difference layer is a monolayer structure.

17. An organic EL display device comprising:
the phase difference plate for an organic EL display device according to claim 1; and
an organic EL light emitting element.

18. An organic EL display device comprising:
the phase difference plate for an organic EL display device according to claim 2; and
an organic EL light emitting element.

19. A method for producing a phase difference plate, used for the manufacture of the phase difference plate for an organic EL display device according to claim 1, the method comprising:
an applying step of applying a composition containing a polymer having a repeating unit A including a photo-alignment group including a double bond structure of C=C or C=N and a polymerizable liquid crystal compound having reciprocal wavelength dispersion onto a transparent support to form a coating film;
an irradiating step of performing irradiation with polarized ultraviolet rays from a direction perpendicular to the coating film; and
a heating step of subjecting the coating film to a heating treatment after the irradiating step to form a phase difference layer.

20. A method for producing a phase difference plate, used for the manufacture of the phase difference plate for an organic EL display device according to claim 2, the method comprising:
an applying step of applying a composition containing a polymer having a repeating unit A including a photo-alignment group including a double bond structure of C=C or C=N and a polymerizable liquid crystal compound having reciprocal wavelength dispersion onto a transparent support to form a coating film;
an irradiating step of performing irradiation with polarized ultraviolet rays from a direction perpendicular to the coating film; and
a heating step of subjecting the coating film to a heating treatment after the irradiating step to form a phase difference layer.

* * * * *